United States Patent
Li et al.

(10) Patent No.: US 11,001,497 B2
(45) Date of Patent: May 11, 2021

(54) HIGH PERFORMANCE TOPOLOGICAL INSULATOR TRANSISTORS

(71) Applicants: Qiliang Li, Fairfax, VA (US); Curt A Richter, Gaithersburg, MD (US); Hao Zhu, Gaithersburg, MD (US)

(72) Inventors: Qiliang Li, Fairfax, VA (US); Curt A Richter, Gaithersburg, MD (US); Hao Zhu, Gaithersburg, MD (US)

(73) Assignee: GEORGE MASON UNIVERSITY, Fairfax, VA (US)

(*) Notice: Subject to any disclaimer, the term of this patent is extended or adjusted under 35 U.S.C. 154(b) by 0 days.

(21) Appl. No.: 14/652,017

(22) PCT Filed: Dec. 12, 2013

(86) PCT No.: PCT/US2013/074773
§ 371 (c)(1),
(2) Date: Jun. 12, 2015

(87) PCT Pub. No.: WO2014/093681
PCT Pub. Date: Jun. 19, 2014

(65) Prior Publication Data
US 2015/0333163 A1  Nov. 19, 2015

Related U.S. Application Data

(60) Provisional application No. 61/736,743, filed on Dec. 13, 2012, provisional application No. 61/745,565, (Continued)

(51) Int. Cl.
*B82Y 10/00* (2011.01)
*H01L 29/775* (2006.01)
(Continued)

(52) U.S. Cl.
CPC .......... *B82Y 10/00* (2013.01); *H01L 29/0673* (2013.01); *H01L 29/66984* (2013.01);
(Continued)

(58) Field of Classification Search
CPC .............. G01R 19/00; H01L 29/78609; H01L 29/78615
(Continued)

(56) References Cited

U.S. PATENT DOCUMENTS

2003/0224168 A1* 12/2003 Mack ..................... B82Y 40/00
428/408
2012/0138887 A1*  6/2012 Zhang .................... H01L 31/08
257/9
(Continued)

OTHER PUBLICATIONS

He "review of 3D topological insulator thin-film growth by molecular beam eitaxy and potential applications," Phys. Status Solidi RRL 7, No. 1-2, 50-63, 2013.*
(Continued)

*Primary Examiner* — Bo Fan
(74) *Attorney, Agent, or Firm* — Ballard Spahr LLP

(57) ABSTRACT

Topological insulators, such as single-crystal $Bi_2Se_3$ nanowires, can be used as the conduction channel in high-performance transistors, a basic circuit building block. Such transistors exhibit current-voltage characteristics superior to semiconductor nanowire transistors, including sharp turn-on, nearly zero cutoff current, very large On/Off current ratio, and well-saturated output current. The metallic electron transport at the surface with good effective mobility can be effectively separated from the conduction of the bulk topological insulator and adjusted by field effect at a small gate voltage. Topological insulators, such as $Bi_2Se_3$, also have a magneto-electric effect that causes transistor threshold voltage shifts with external magnetic field. These prop-
(Continued)

erties are desirable for numerous microelectronic and nanoelectronic circuitry applications, among other applications.

20 Claims, 30 Drawing Sheets

Related U.S. Application Data filed on Dec. 22, 2012, provisional application No. 61/745,564, filed on Dec. 22, 2012.

(51) Int. Cl.
| | |
|---|---|
| *H01L 29/06* | (2006.01) |
| *H01L 29/82* | (2006.01) |
| *H01L 29/66* | (2006.01) |
| *H01L 49/00* | (2006.01) |
| *H01L 29/786* | (2006.01) |

(52) U.S. Cl.
CPC ...... *H01L 29/775* (2013.01); *H01L 29/78696* (2013.01); *H01L 29/82* (2013.01); *H01L 49/003* (2013.01)

(58) Field of Classification Search
USPC .......................................... 324/76.11; 427/58
See application file for complete search history.

(56) References Cited

U.S. PATENT DOCUMENTS

| | | | |
|---|---|---|---|
| 2012/0156833 A1 | 6/2012 | Kawashima et al. | |
| 2012/0267719 A1* | 10/2012 | Brindle | ............... H01L 29/7841 257/348 |
| 2012/0273763 A1 | 11/2012 | Banerjee et al. | |
| 2012/0298949 A1* | 11/2012 | Chang | .................... B82Y 10/00 257/9 |
| 2012/0305893 A1* | 12/2012 | Colinge | ............ H01L 29/66795 257/29 |

OTHER PUBLICATIONS

Wang "manipulating surface states ipological insulator nanoribbons," Nature Nanotechnology, Feb. 13, 2011, vol. 6.*
Cui "aharonov-bohm inteferencn topological insulator nanoribbons," Nature Materials, vol. 9, Mar. 2010.*
Zhang "topological insators in Bi2Se3, Bi2Te3 and S2Te3 with a single Dirac cone on the surface," Nature Phys. 5, 38-442, 2009.*
Kromhout et al. "team controls conduction, surface states in topological insulator nanoribbons", Feb. 13, 2011.*
Bergin et al., "The effect of nanowire length and diameter on the properties of transparent, conducting nanowire films," Nanoscale Feb. 2012, vol. 4, pp. 1996-2004.*
Wang et al., "Manipulating surface states in topological insulator nanoribbons," Apr. 2011, Nature Nanotechnology, vol. 6, pp. 216-221.*
International Search Report and Written Opinion dated May 27, 2014 by the International Searching Authority for International Application No. PCT/US13/74773, which was published as WO/2014/093681 on Jun. 19, 2014 (Inventor—Qiliang, et al.; Applicant—George Mason Univ.) (10 Pages).
PCT, PCT/US2013/74773 (WO/2014/093681), Dec. 12, 2013 (Jun. 12, 2014), Qiliang.

* cited by examiner

HIGH PERFORMANCE TOPOLOGICAL INSULATOR TRANSISTORS

CROSS-REFERENCE TO RELATED APPLICATION

The present application is a U.S. National Phase Application of International Application No. PCT/US2013/074773, filed Dec. 12, 2013, which claims priority to U.S. Application No. 61/736,743, filed Dec. 13, 2012, and to U.S. Application No. 61/745,565, filed Dec. 22, 2012, and to U.S. Application No. 61/745,564, filed Dec. 22, 2012, each application is incorporated herein fully by this reference.

STATEMENT REGARDING GOVERNMENT SUPPORT

This invention was made with government support under NSF 20006A awarded by the United States National Science Foundation. The government has certain rights in the invention.

FIELD OF THE INVENTION

The present invention relates to topological insulator field-effect transistors.

BACKGROUND—INTRODUCTION

Topological insulators (TI) are characterized as a new class of materials that have insulating band gaps in the bulk but gapless surface states topologically protected by time-reversal symmetry. Recently discovered three-dimensional (3D) TI materials, such as $Bi_2Se_3$, $Bi_2Te_3$ and $Sb_2Te_3$, have been intensively investigated both theoretically and experimentally. The gapless surface states featuring helical Dirac electrons have been observed by angle-resolved photoemission spectroscopy and scanning tunneling microscopic techniques. TI thin films and TI nanoribbons show anomalous high-field magnetoresistance, coherent surface transport induced by Aharonov-Bohm interference, and optoelectronic properties due to the spin-polarized surface states. However, device applications exploiting their remarkable properties have so far been hampered by the difficulty to electrically tune the Fermi levels of both bulk and thin film samples.

The binary compound $Bi_2Se_3$ has been reported as a three-dimensional (3D) topological insulator with an ~0.3 eV band gap in bulk, gapless surface states, and a single Dirac cone inside the gap on the surface. Other stoichiometric binary compounds such as $Bi_2Te_3$ and $Sb_2Te_3$ have also been identified as 3D topological insulators showing robust surface states. The nontrivial gapless (i.e., metallic) surface states are protected by time-reversal symmetry from backscattering. The spin of electrons at the surface is perpendicular to the surface, either spin-up or spin-down, following the time-reversal symmetry. Such a quantized spin state is very attractive for spintronics and magnetic field related electronics. The surface states with quantized electron spin have also been observed by the angle-resolved photoemission spectroscopy (ARPES) methods.

The nontrivial surface states which are protected by time-reversal symmetry from backscattering have been observed by the angle-resolved photoemission spectroscopy (ARPES) methods. Recently, full energy gap for the bulk state has been achieved in $Bi_2Te_3$ by appropriate hole doping, and the bulk carrier density can be significantly lowered by tuning the composition of a ternary sesquichalcogenide $(Bi_xSb_{1-x})_2Te_3$. The distinctive property of topological insulators provides a very promising pavement for future nanoelectronics and spintronics applications. Especially the binary $Bi_2Se_3$ with relatively large nontrival bulk gap has great potential to realize the elusive Majorana fermions and the Dirac monopole particle.

Up to now, significant efforts on topological insulator have been focused on exfoliated thin samples from the topological insulator bulk material and material characterization. High quality single-crystal topological insulator materials can be prepared by, for example, Molecular Beam Epitaxy (MBE) thin film deposition and Vapor-Liquid-Solid (VLS) growth of nanowires and nanoribbons. However, devices exploiting the distinctive properties of topological insulators have not yet been realized.

SUMMARY

High-performance topological insulator transistors, with embodiments having elements such as $Bi_2Se_3$ nanowire, are disclosed. A transistor device may include a source and a drain, a conduction channel comprising a topological insulator material between the source and the drain; and a first gate over the topological insulator material. The topological insulator material may include one or more of Bismuth and Tellurium. For example, the topological insulator material may be $Bi_2Se_3$. In some embodiments the topological insulator material may be in the form of a nanowire, which is a nanoscale rod-like structure. Some nanowire embodiments have lengths ranging from about 100 nm to about 30 µm, and diameters of about 100-200 nm, although these dimensions are not intended to be limiting. The topological insulator material may be self-aligned. In some embodiments, the topical insulator material is physically connected to the source and the drain. The gate may be spaced apart from the topological insulator material by a dielectric material in some embodiments, such that the dielectric material is between the topological insulator material and the gate. In some embodiments, the dielectric material may include an oxide material, such as $HfO_2$. The source, the drain, and the topological insulator material may, in some embodiments, be disposed over a substrate, such as Si. The substrate in some embodiments may include an oxide layer, such as $SiO_2$. If the topological insulator is in the form of a nanowire, the nanowire in some embodiments may have a generally hexagonal cross-sectional area.

Topological insulator transistors have numerous potential applications, including field-effect transistors and sensors in a variety of microelectronic and nanoelectronic circuitry. For instance, they can be used as a three-terminal magnetoresistance sensor based on the magneto-electric effect of a high-performance $Bi_2Se_3$ nanowire field-effect transistor.

Self-aligned $Bi_2Se_3$ nanowire field-effect transistors (NWFET) with excellent performance can be fabricated on a large-scale. A process for forming a topological insulator transistor may include forming a catalyst on a substrate, forming a topological insulator material using the catalyst on the substrate, forming a source and a drain on the substrate, the source and the drain in physical contact with the topological insulator material, and forming a gate over the topological insulator material. The topological insulator may be $Bi_2Se_3$, and in some embodiments may be in the form of a nanowire. The dielectric material may be applied through a process such as atomic layer deposition. The catalyst may include a metal. In some embodiments, a vapor-liquid-solid process may be used to form the topological insulator material. One or more of a photolithography process and an evaporation process may be used to form one or more of the source and the drain. In some embodiments, a lift-off process may be used to form one or more of the source, the drain and the gate. Prototype NWFETs have shown sharp switching, large ON/OFF ratio, large electron effective mobility and close-to-zero off-state current. Based on current-voltage characteristics, the NWFET conduction is believed to be mainly due to the surface gapless states.

Single-crystal $Bi_2Se_3$ nanowires can be used as the conduction channel in high-performance field effect transistor (FET), a basic circuit building block. Other stoichiometric binary compounds such as $Bi_2Te_3$ and $Sb_2Te_3$ may be good candidates for use in topological insulator transistors such as NWFET. The current-voltage characteristics (e.g., including sharp turn-on, nearly zero cutoff current, very large On/Off current ratio, and well-saturated output current) of single-crystal NWFETs are superior to many of those reported for semiconductor nanowire transistors. The metallic electron transport at the surface with good FET effective mobility can be effectively separated from the conduction of bulk $Bi_2Se_3$ and adjusted by field effect at a small gate voltage. This opens up a suite of potential applications in nanoelectronics and spintronics.

As one example of many, a three-terminal transistor magnetic field sensor can be manufactured. Such sensing devices are very attractive for both sensing and magnetic logic applications. NWFETs outperform conventional MOSFET, and can be tuned and controlled by both electric and magnetic fields. The devices exhibited sharp turn-on current, zero off-state current and well-saturated output current-voltage characteristics which fulfill the requirements for digital and analog circuit applications. In these transistors, the electron field effect mobility and effective mobility reach as high as ~5000 $cm^2/Vs$ and the transconductance reaches as high as ~9 $\mu S$. The conduction and threshold voltage of TINFETs can also be tuned by magnetic field. A magnetic field of 0.2 T can shift the transistor's threshold voltage 1.8 V, which is very promising for next-generation multi-functional logic and memory in nanoelectronics and spintronics. The transistor resistance with a small magnetic field is about 108 times the transistor resistance without a small magnetic field, which makes these devices very attractive for numerous applications, such as sensor applications.

DESCRIPTION

Figure 1:
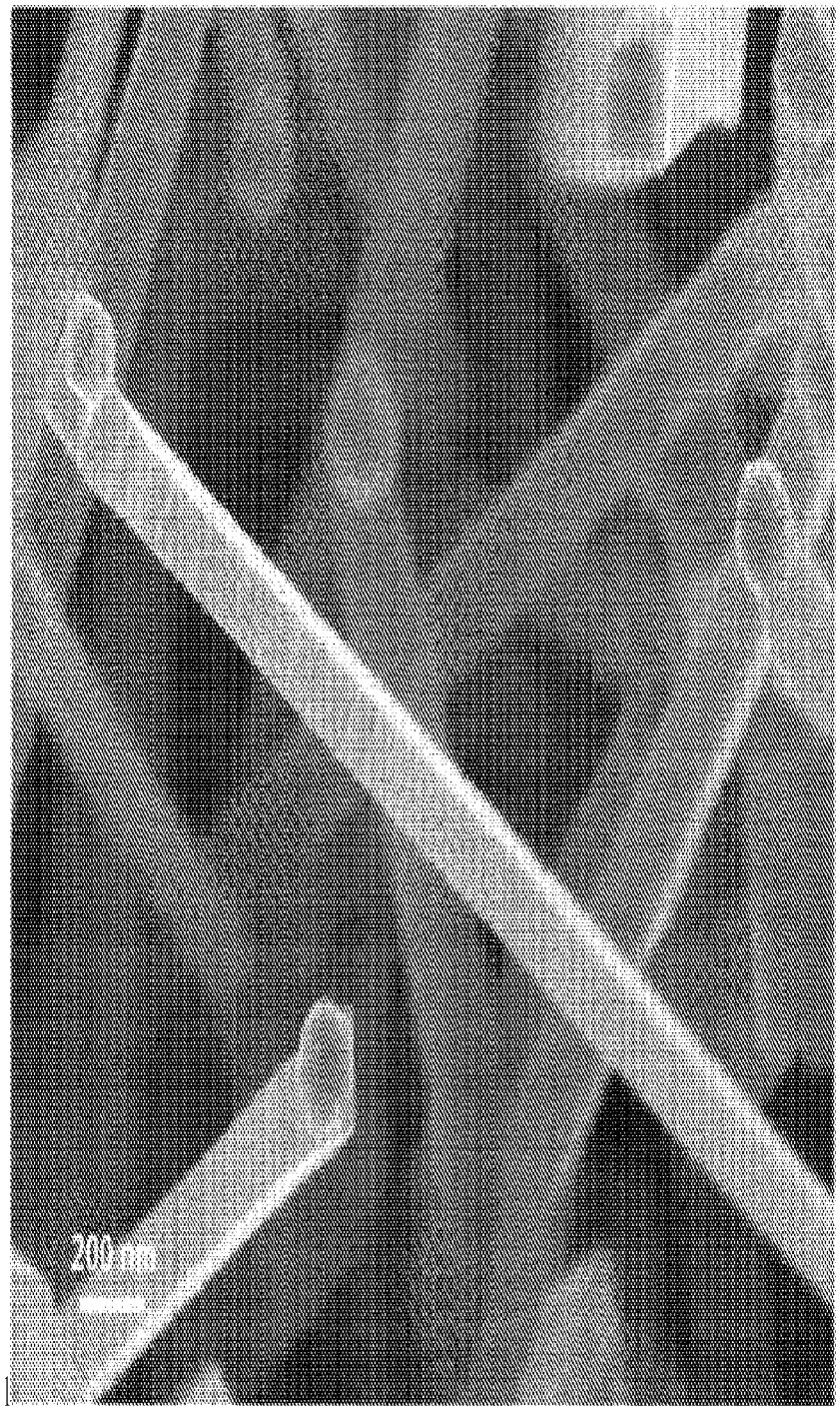
FIG. 1 is a SEM image of $Bi_2Se_3$ nanowires.

Microelectric devices based on topological insulators could be considered analogs of metal oxide semiconductor field effect transistors (MOSFETs). The MOSFET is the basic building block in complementary metal oxide semiconductor (CMOS) technology, the fundamental basis for digital and analog circuits. The surface conduction of Si in conventional CMOS devices is protected by thermal $SiO_2$ to optimize its inversion properties for good transistor performance. This is one of the primary reasons why Si is preferred over other semiconductor materials for CMOS technology. For a topological insulator material, the gapless surface state is derived from its inherent material properties, and maintains a robust surface conduction. Therefore the integration of TI as the active conduction channel in MOSFETs is very attractive because it will leverage the advantages afforded by the novel TI materials with the vast infrastructure of current semiconductor technology.

The inventors fabricated and measured surrounding-gate $Bi_2Se_3$ nanowire field-effect transistors. The nanowires were grown from Au catalyst and integrated by using a self-alignment technique. The FET current-voltage (I-V) characteristics were measured at different temperatures, exhibiting excellent performance. The separation of surface metallic conduction from bulk semiconductor conduction with gate electric field was studied at different temperatures. The activation energy of bulk conduction was found to be very close to the band gap of bulk $Bi_2Se_3$. The effective electron mobility and scattering mechanism in prototype devices was also studied.

Fabrication of Prototype Transistors

Transistors as described herein may comprise a substrate, such as a Si layer, an oxide layer, a conducting channel comprising a topological insulator, and a top gate over the topological insulator. The conducting channel may be in the form of nanowires, the particular shape of which will depend on the molecular composition. Nanowires may be single crystal nanowires, such as single-crystal $Bi_2Se_3$ nanowires, and may be self-aligned. An insulating layer, comprising a dielectric material such as $HfO_2$, may be positioned between the topological insulator and the top gate, such that the topological insulator is spaced apart from the top gate.

Prototype embodiments of topological insulator transistors, and in particular self-aligned $Bi_2Se_3$ NWFETs, were fabricated on a substrate comprising a highly doped p-type Si wafer with an oxide layer comprising a 300 nm layer of thermal $SiO_2$. One of ordinary skill should understand that this process can be modified to produce transistors using different materials, such as other stoichiometric binary compounds. For example, one of ordinary skill would understand that other nanowire fabrication methods, such as top-down defining by using electron-beam lithography, molecular beam epitaxy and physical vapor deposition, can be used to prepare binary compounds used as topological insulator materials.

The thermal $SiO_2$ oxide layer was grown by dry oxidation on a Si wafer. On the top of the wafer, the $Bi_2Se_3$ nanowires were grown from Au catalyst deposited by sputtering in pre-defined locations. The nanowire growth followed a solid-vapor-solid route. The wafers (with Au) were loaded at the downstream end in a horizontal tube furnace while $Bi_2Se_3$ source powder was located at the heat center of the furnace. Then the furnace is heated to a temperature in a range of 500° C.~550° C. and kept in that temperature for 2 h under a flow of 50 standard cubic centimeters (sccm) Ar as carrier gas. The as-grown $Bi_2Se_3$ nanowires were about 20 μm in length and 150 nm in diameter. Then 3 nm/100 nm Ti/Pt source/drain (S/D) electrodes were patterned on the nanowires at the growth location by photolithography, forming Pt/$Bi_2Se_3$ Schottky junctions at both source and drain, thereby physically connecting the topological insulator to the source and the drain. The channel length was defined to be 2 μm. A layer of 30-nm $HfO_2$ was then deposited at 250° C. by atomic layer deposition (ALD) with precursors of Tetrakis(ethylmethylamino)hafnium and water covering the nanowire channel and also part of S/D electrodes. Preferably, the last step is the formation of a 100 nm Pd top gate located over the topological insulator, by a suitable process such as a lift-off process. In the presence of the $HfO_2$ layer, the gate is spaced apart from the topological insulator. Unlike the traditional nanowire harvesting and alignment methods, this self-alignment approach not only enables simultaneous batch fabrication of reproducible and homogeneous nanowire devices of high quality, but also limits the contamination of the nanowire during the fabrication process.

$Bi_2Se_3$ has a layered rhombohedral crystal structure with five covalently bonded atoms in one unit cell. These quintuple layers are linked by Van der Waals interactions. The as-synthesized $Bi_2Se_3$ nanowires were examined by scanning electron microscopy (SEM). As shown in FIG. 1, the VLS-synthesized $Bi_2Se_3$ nanowires had diameters of about 100-200 nm, and lengths ranging from 100 nm to tens of micrometers. The gold nanoparticle on the end of each nanowire suggests the VLS mechanism.

Figure 2:
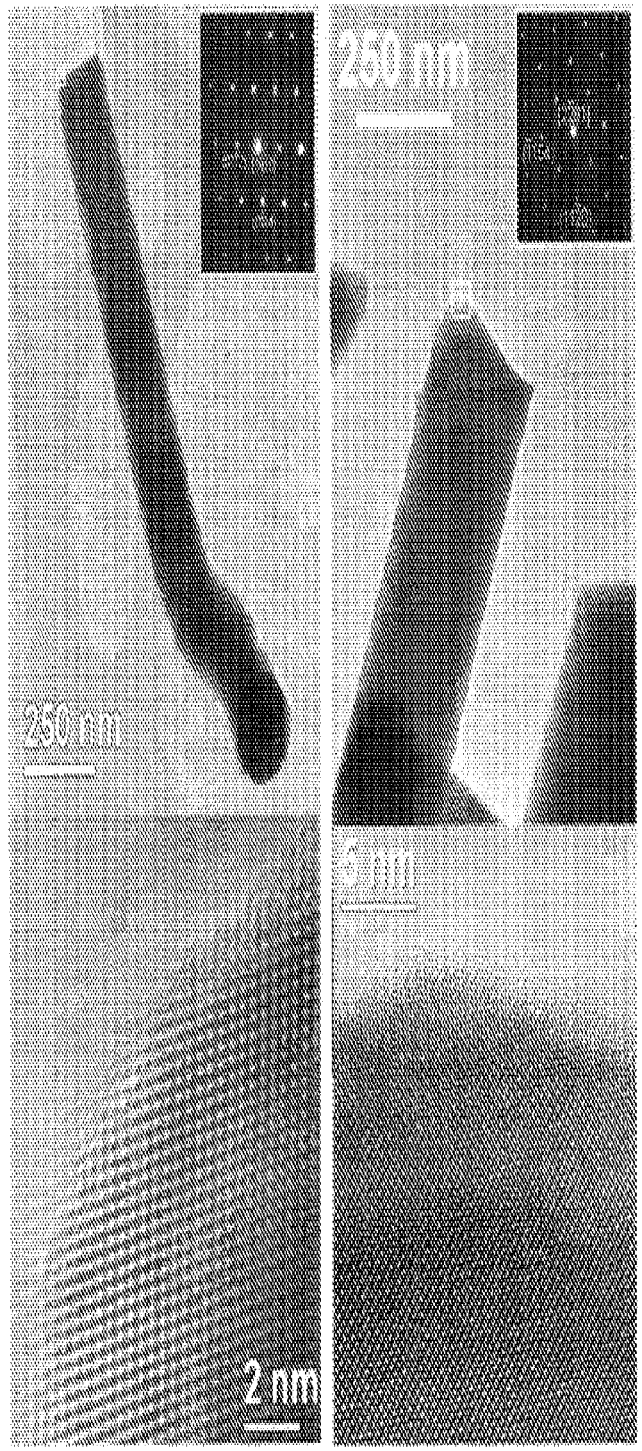
FIG. 2 shows transmission electron microscope (TEM) measurements of $Bi_2Se_3$ nanowires.

As shown in FIG. 2, transmission electron microscopy (TEM) measurements were used to determine the crystal structure of $Bi_2Se_3$ nanowires. Selected-area electron diffraction (SAED) patterns indicate a good single-crystal rhombohedral phase, with the growth direction of [1120]. High resolution TEM image shows the hexagonal lattice edges, confirming the single-crystalline phase.

Figure 3A:
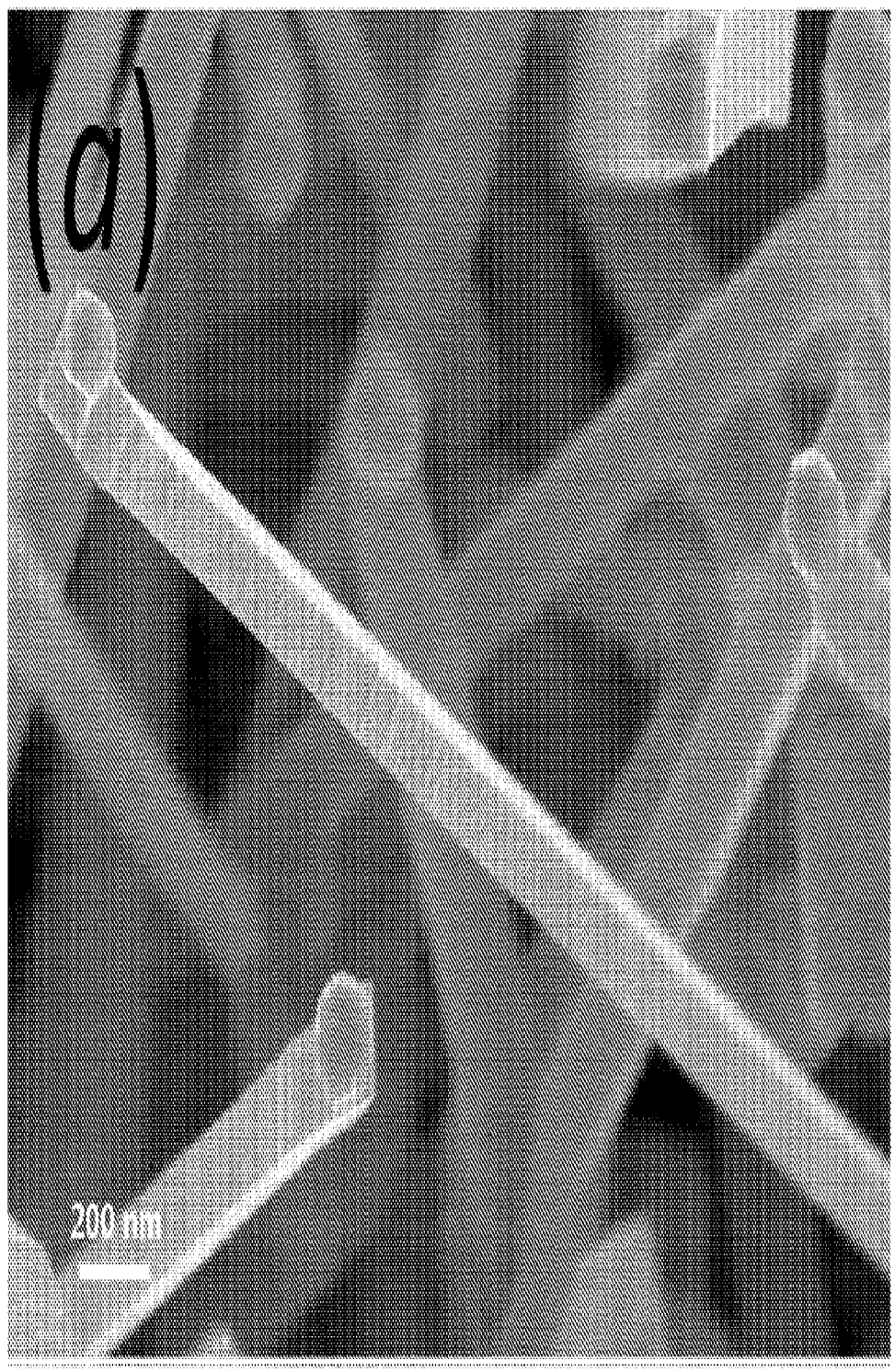
FIGS. 3(*a*)-(*d*) are (a) SEM and (a) TEM of $Bi_2Se_3$, (c) schematic of a $Bi_2Se_3$ NWFET, (d) TEM cross-section of NWFET.
Figure 3B:
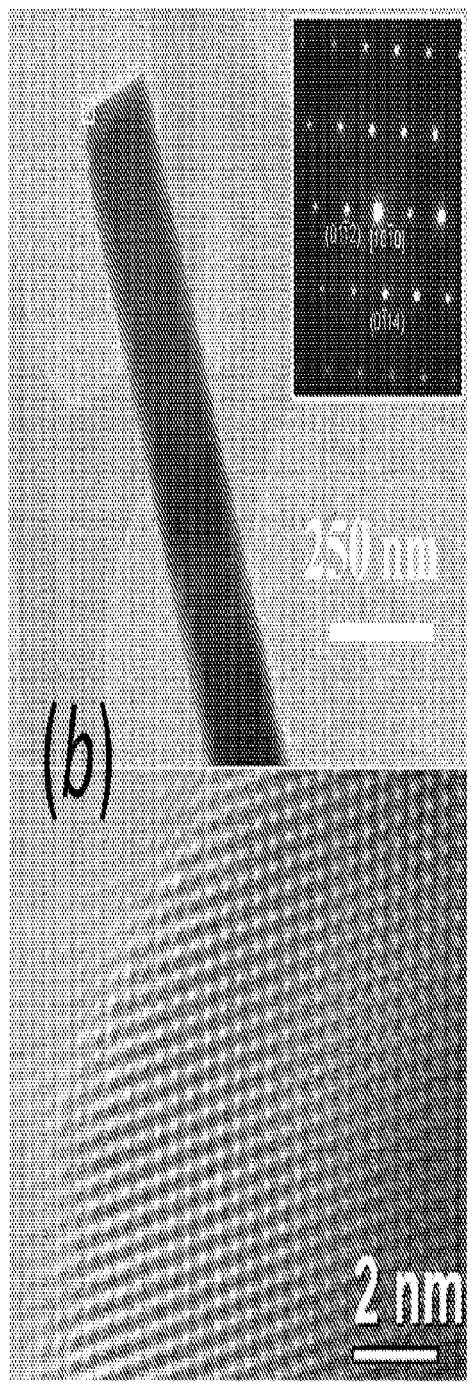
Figure 3C:
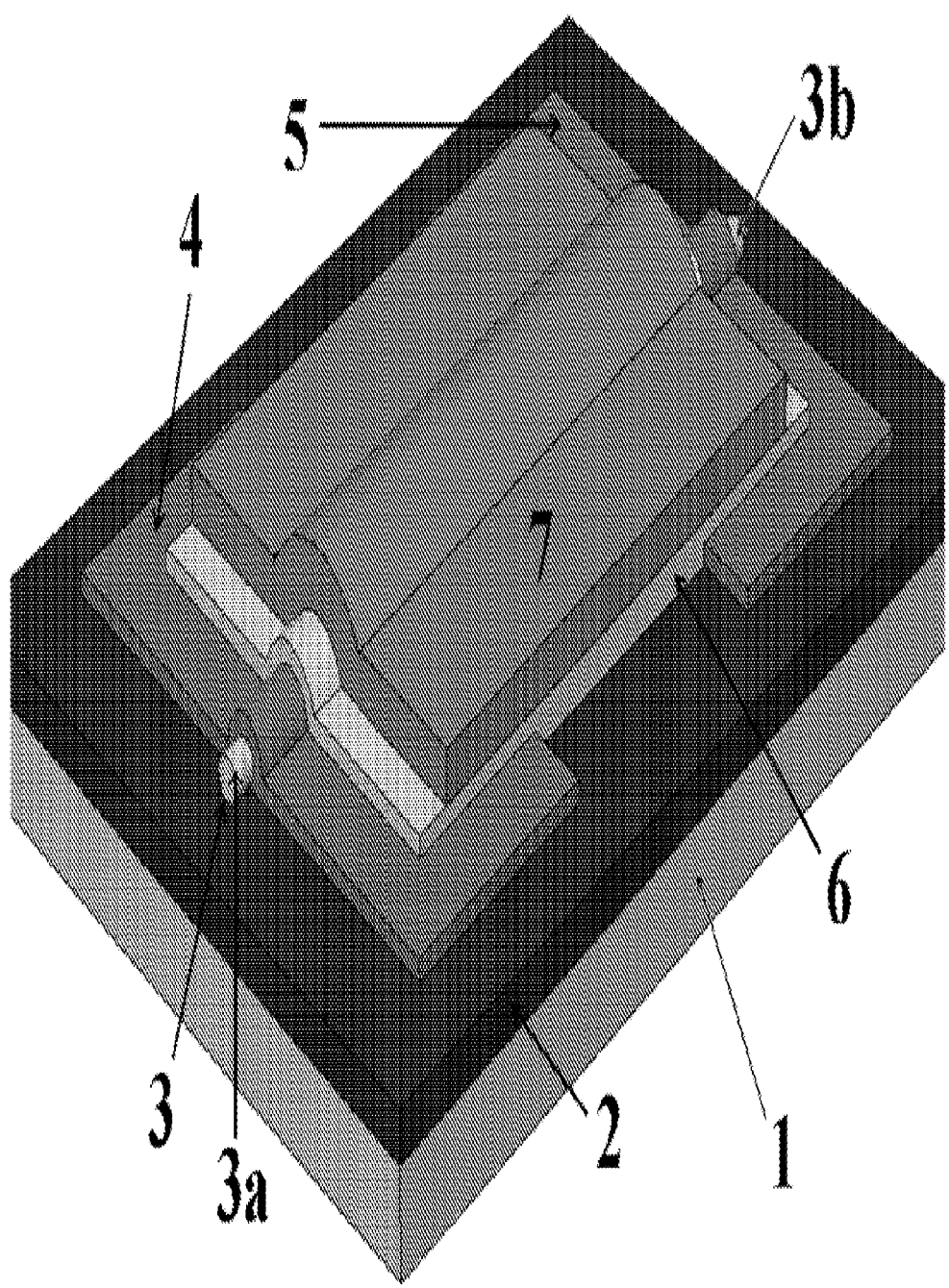
Figure 3D:
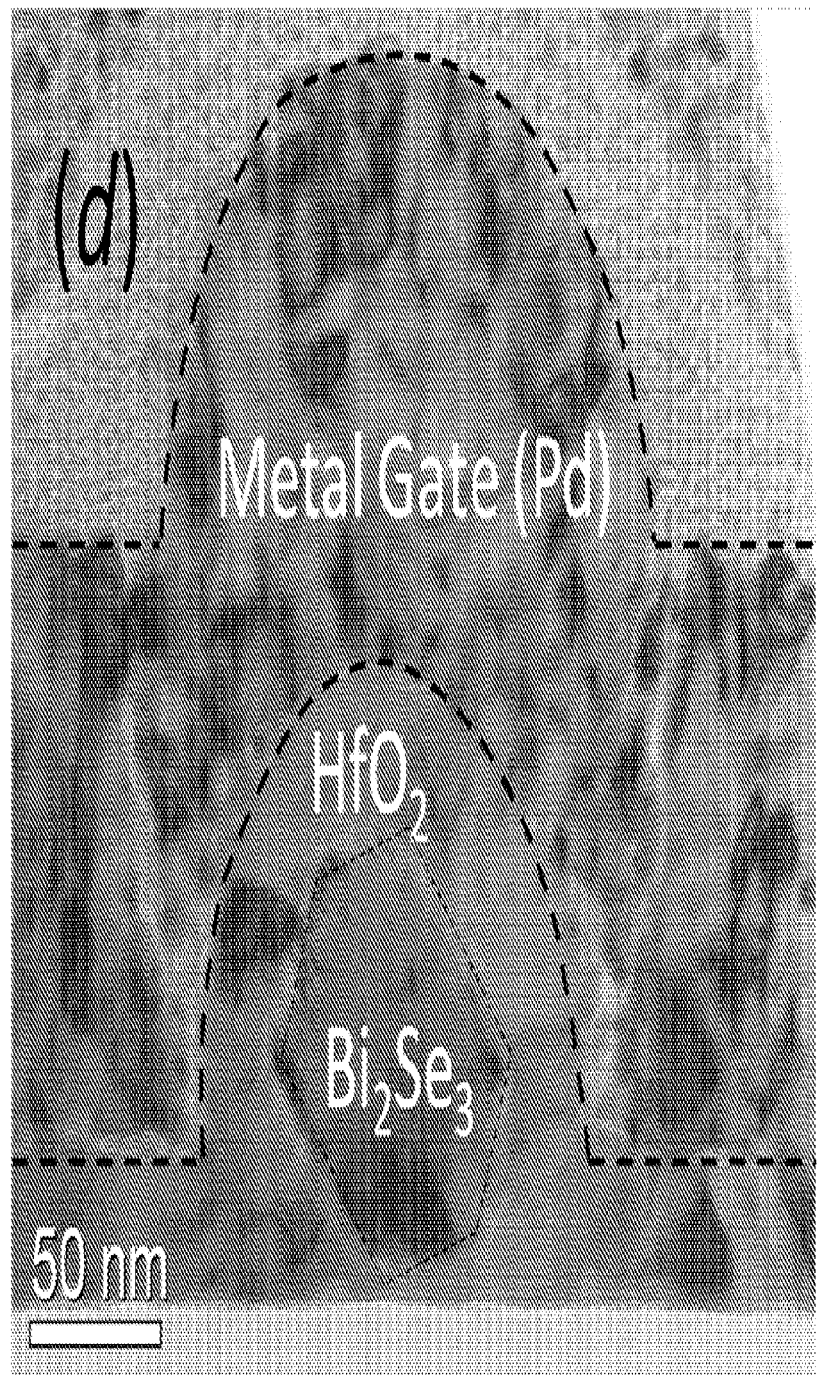

FIG. 3(a) shows a scanning electron microscopy (SEM) image of the as-synthesized $Bi_2Se_3$ nanowires which are about 50 nm to 150 nm wide and 10 μm long. Au nanoparticles (NPs) were found at the top-end of each nanowire. This indicated that $Bi_2Se_3$ vapor was first absorbed by Au catalyst to form a $Bi_2Se_3$ and Au eutectic; then $Bi_2Se_3$ diffused through Au to form the single-crystal nanowires. This process is similar to the growth of Si nanowires governed by vapor-liquid-solid (VLS) mechanism. The high-resolution transmission electron microscopy (HRTEM) image shown in FIG. 3(b) demonstrates that the $Bi_2Se_3$ nanowires are in a well-defined single-crystal rhombohedral phase and the growth direction is close to [1120]. A schematic of an embodiment of a $Bi_2Se_3$ nanowire FET is shown in FIG. 3(c) and a TEM image of the cross-section in FIG. 3(d). In the prototype embodiment shown, the hexagonal nanowire core conduction channel is surrounded first by the insulating $HfO_2$ layer and then by the top gate over the nanowire, which is Omega-shaped in one embodiment.

The $Bi_2Se_3$ NWFET embodiment shown in FIG. 3(c) comprises substrate 1 comprised of Si. The substrate has an oxide layer 2 of thermal $SiO_2$ disposed on an upper surface of substrate 1. A $Bi_2Se_3$ nanowire 3 is formed on the surface of oxide layer 2 opposite from the upper surface of substrate 1. Separate and spaced-apart Ti/Pt source 4 and drain 5 electrodes are patterned on surface of oxide layer 2 opposite from the upper surface of substrate 1. In this embodiment, a portion of the electrodes 4 and 5 are patterned over respective portions of nanowire 3, such that nanowire 3 is in physical contact with each electrode 4 and 5, thereby forming Schottky junctions. The longitudinal ends 3a and 3b of nanowire 3 may extend beyond the portions of electrodes 4 and 5 patterned over nanowire 3, as shown in FIG. 3(c). A dielectric material layer 6 of $HfO_2$ is deposited over at least portions of the source 4 and the drain 5, and a length of nanowire 3 between the source and the drain. The dielectric material layer 6 is positioned such that top gate 7 is spaced apart from the oxide layer 2, nanowire 3, and electrodes 4 and 5.

Figure 4:
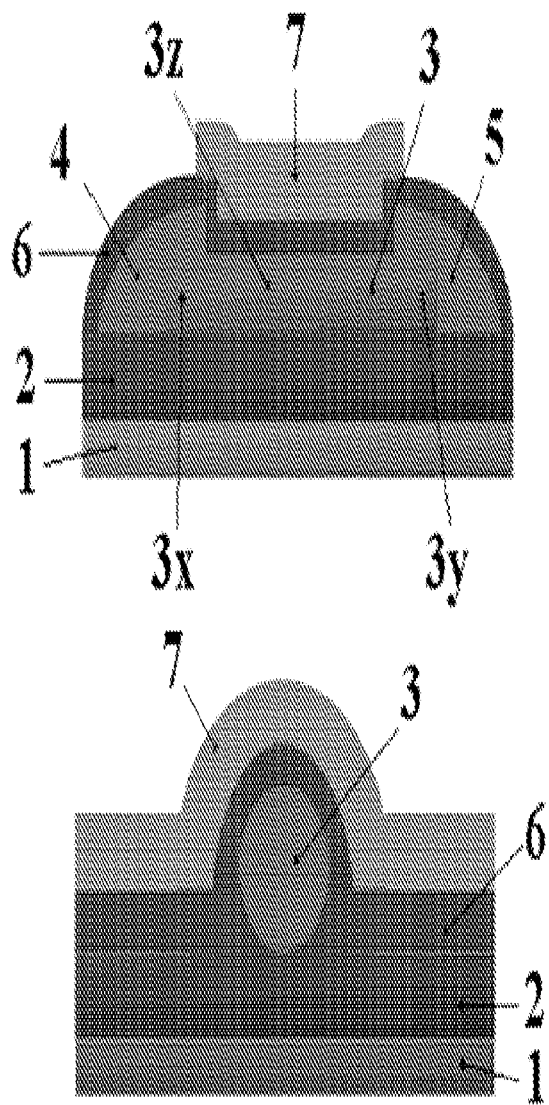
FIG. 4 is a schematic structure of a $Bi_2Se_3$ NWFET from side view (left) and front view (right).

FIG. 4 shows a schematic structure of another embodiment of a self-aligned $Bi_2Se_3$ NWFET. The device is similar to a MOSFET in that the NWFET comprises a gate, source, drain and channel. However, the NWFET embodiment, with $Bi_2Se_3$ as the topological insulator, comprises a $Bi_2Se_3$ nanowire 3 extending along a length of substrate 1 between and in physical contact with the source electrode 4 and drain electrode 5. As shown in FIG. 4, the electrodes 4 and 5 may be patterned such that a portion of each electrode is in physical contact with a respective end portion 3x and 3y of the outer circumferential surfaces (which, in the case of $Bi_2Se_3$, form a hexagonal lattice) and end surface of nanowire 3. Additionally, as shown in FIG. 4, an intermediate portion 3z of nanowire 3 between the end portions 3x and 3y is sandwiched between a $HfO_2$ dielectric material layer 6 and $SiO_2$ oxide layer 2. The embodiment shown includes a top gate 7 over the nanowire 3, spaced apart from the nanowire and the electrodes 4 and 5 by the dielectric material layer 6. Given the foregoing, one of ordinary skill should understand that other topological insulator materials may be used in the NWFET.

Current-Voltage Characteristics

Figure 5A:
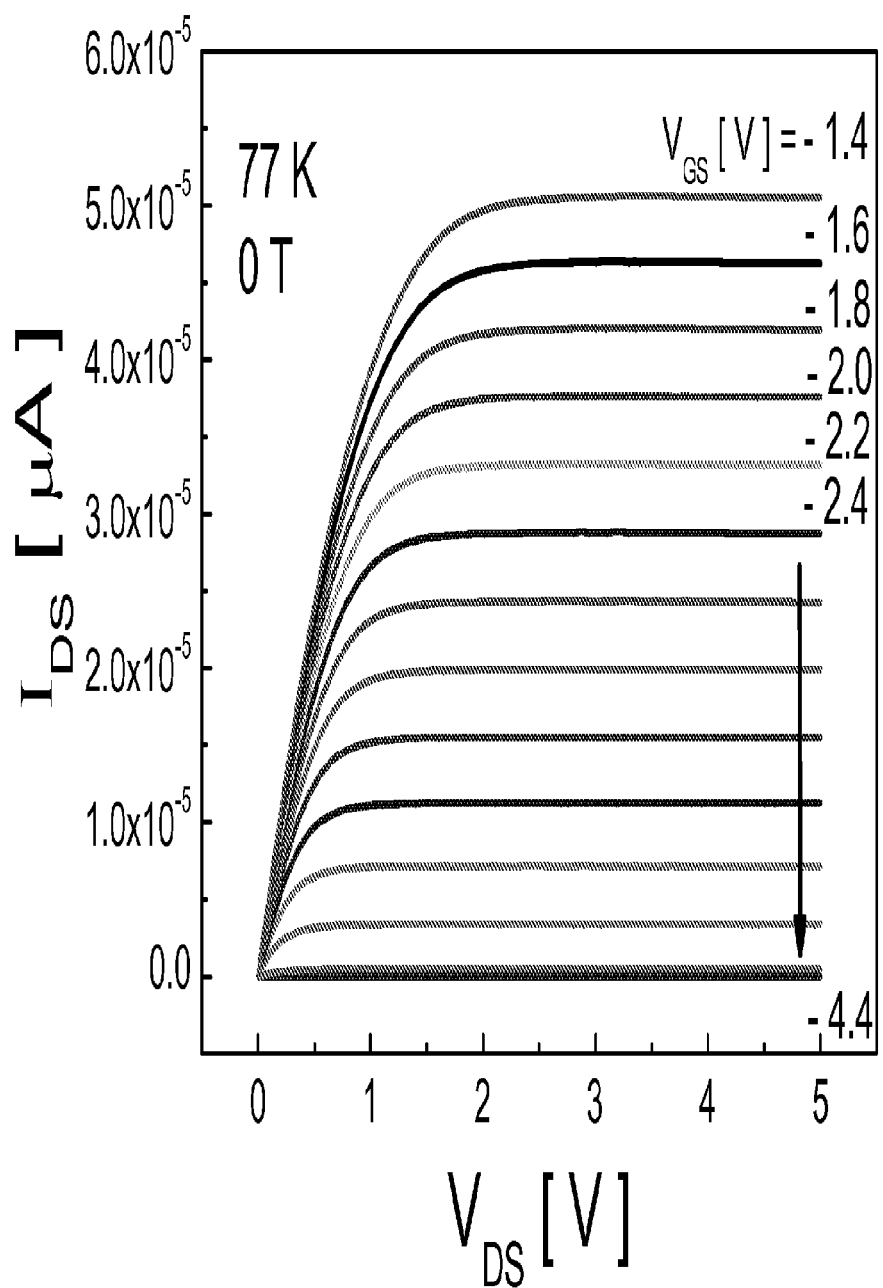
FIG. 5 shows the output current-voltage characteristics of $Bi_2Se_3$ NWFET on a linear scale (left) and a log scale (right).
Figure 5B:
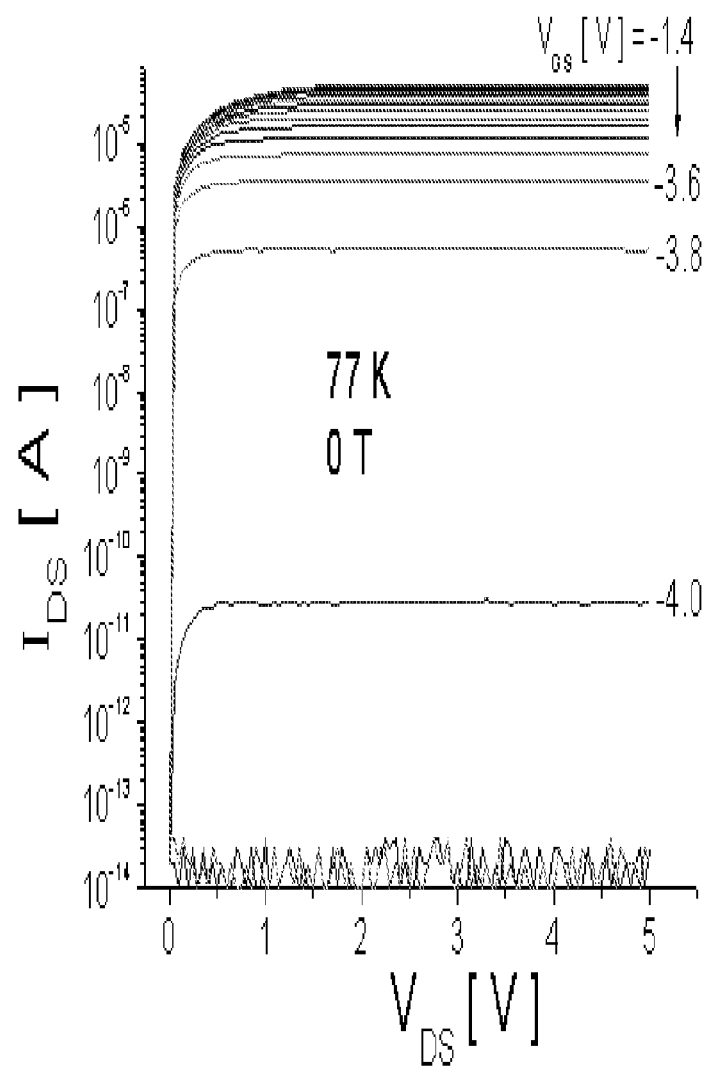
Figure 6:
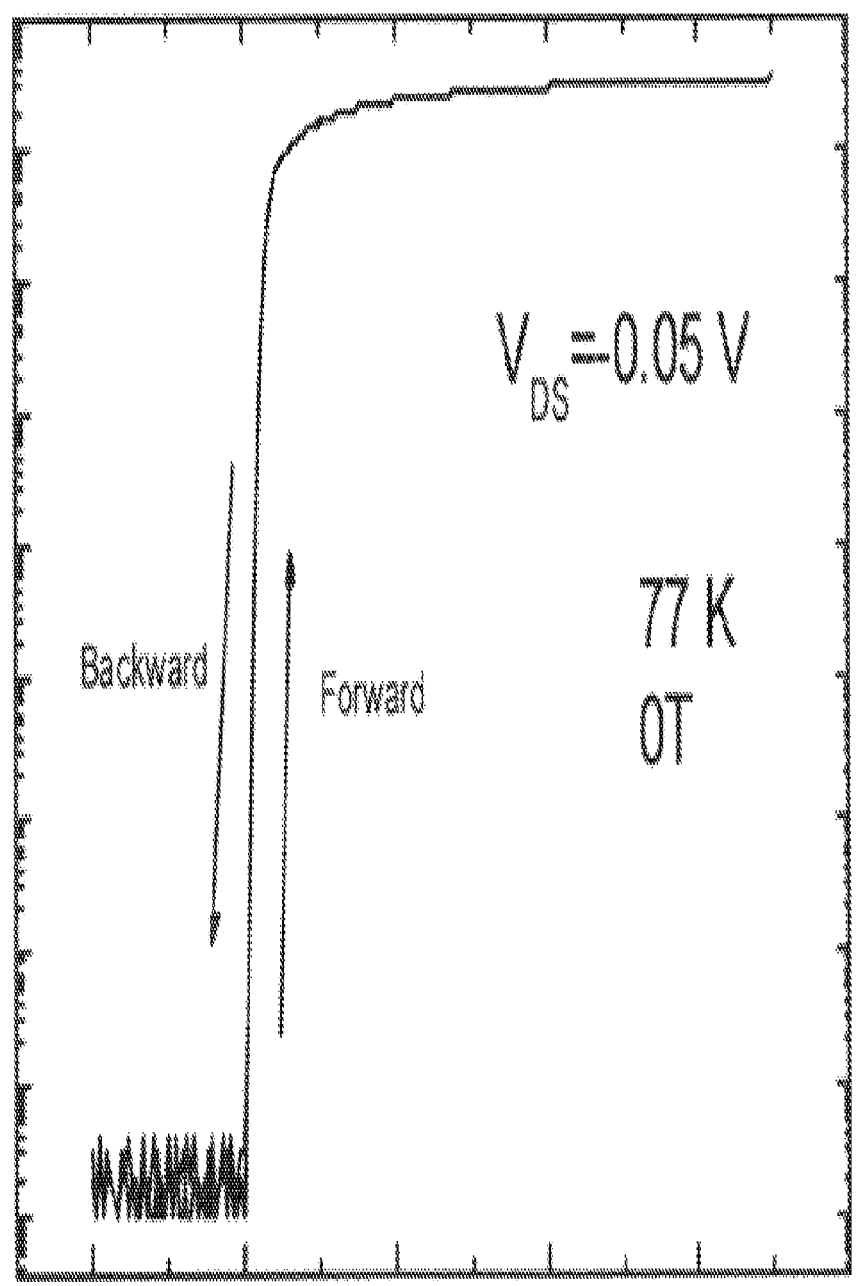
FIG. 6 illustrates the transfer current-voltage characteristics of $Bi_2Se_3$ NWFET.

The prototype $Bi_2Se_3$ nanowire FETs are excellent transistors. The current-voltage characteristics were measured at various temperatures ranging from 77K to room temperature. The output characteristics and transfer characteristics of $Bi_2Se_3$ nanowire FETs at 77K are shown in FIGS. 5 and 6, respectively.

The prototype embodiment of a NWFET device is somewhat similar to a nMOSFET, in that both have simple but effective device structures (no source/drain junction doping). However, NWFET as described herein have numerous advantageous benefits. For instance, as seen in FIGS. 5 and 6, the NWFET had negligible contact resistance. Also, the NWFET exhibited large ON/OFF ratio, around about 109. Further, the extracted subthreshold slope (SS) from the subthreshold region of IDS-VGs was as low as 35 mV/dec.

Figure 7A:
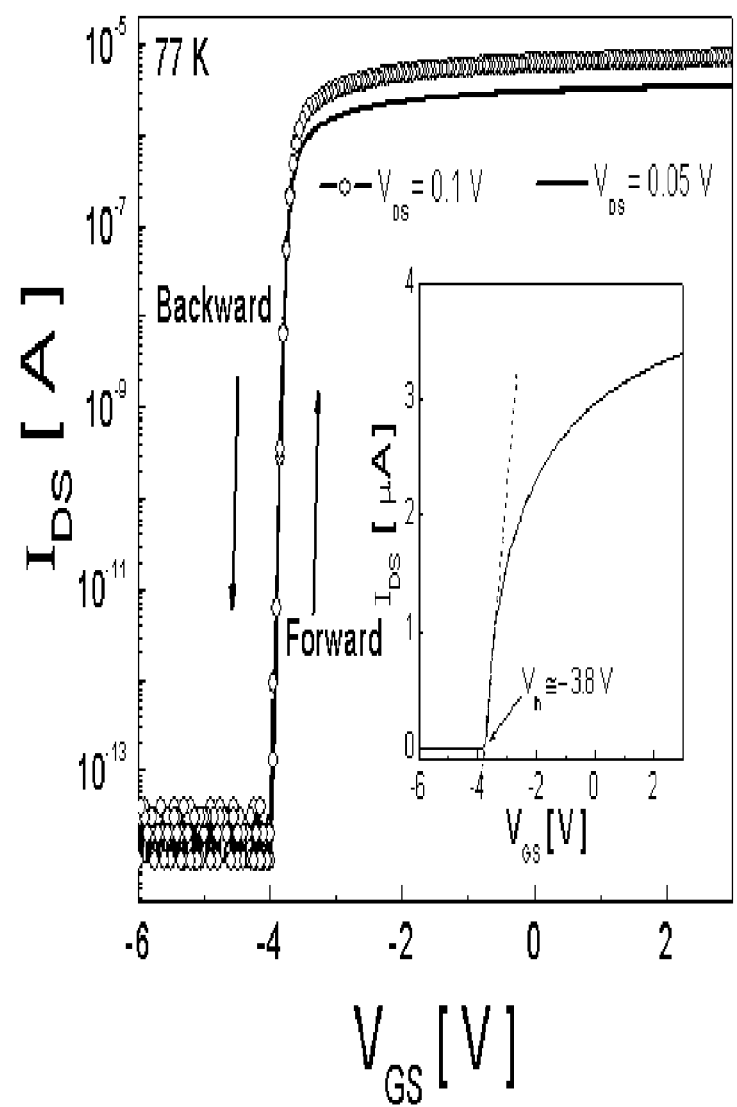
FIG. 7(*a*)-(*d*) show the transfer current-voltage characteristics of $Bi_2Se_3$ NWFET.

The electrical characterization was carried out on a probe station inside a vacuum chamber. As shown in FIG. 7(a), the transistor has excellent drain current ($I_{DS}$) vs. top gate voltage ($V_{GS}$) transfer characteristics: cutoff current close to zero, strong-inversion-like on-state current and current on/off ratio larger than 108 at a $V_{GS}$ swing of 1.0 V. The backside Si was grounded during all the measurements. This embodiment of a transistor has unipolar current dominated by electron conduction. This is similar to a conventional long-channel Schottky-barrier MOSFET with either electron or hole conduction determined by the unipolar Schottky junctions at the source and drain. No hysteresis was observed in the $I_{DS}$-$V_{GS}$ curves at 77 K. A hysteresis shift was observed at higher temperatures (T>240K), most likely due to the activation of traps in the HfO$_2$. Very similar device characteristics were observed for the drain voltage (V$_{DS}$) in the range 0.05 V—4.0 V used in the study.

Figure 7B:
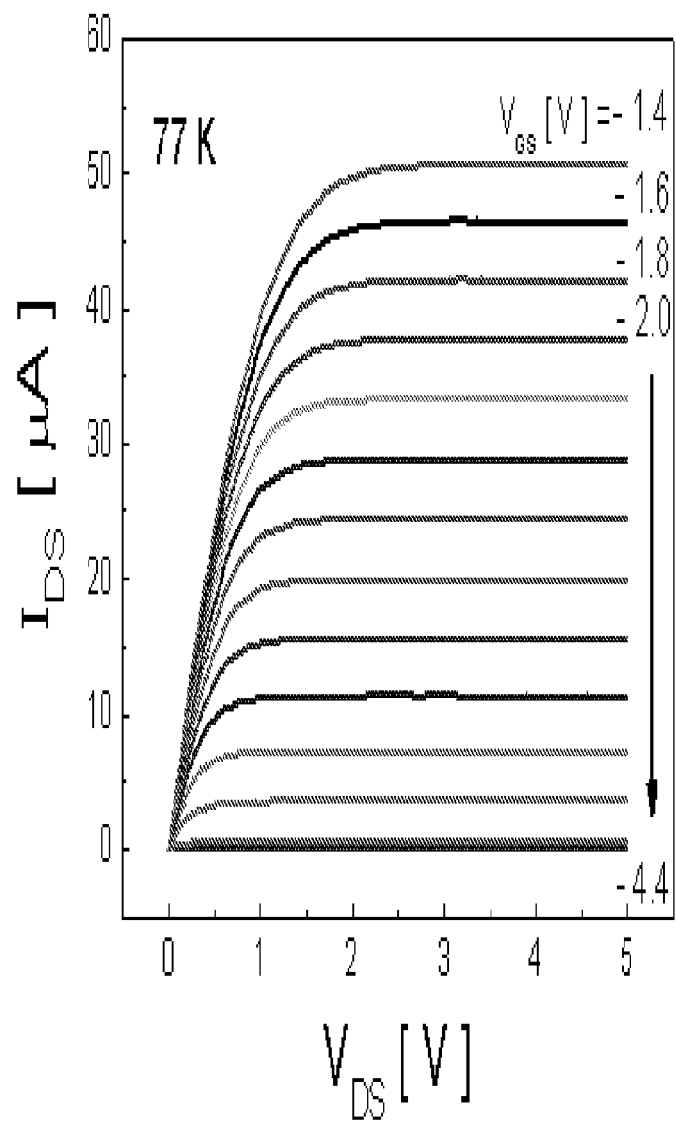
Figure 7C:
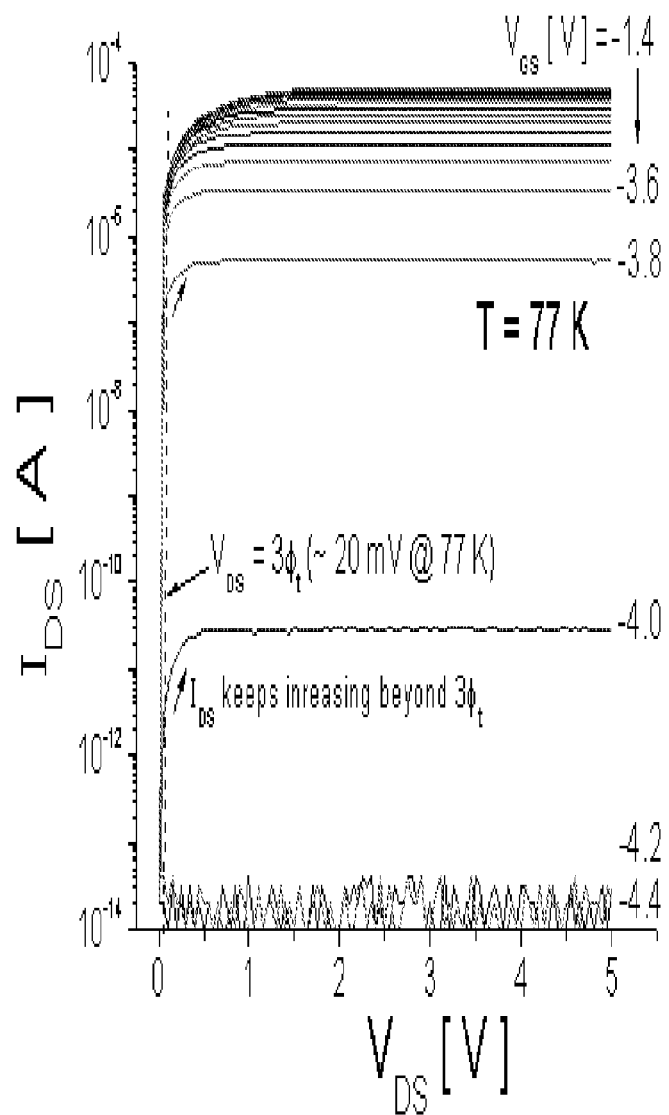

As shown in FIGS. 7(b) and (c), the Bi$_2$Se$_3$ nanowire FET exhibits well-saturated, smooth I$_{DS}$ vs. V$_{DS}$ curves with negligible contact resistance. The transistor output characteristics clearly demonstrate cutoff, weak, moderate and highly conductive regions at different V$_{GS}$, similar to the cutoff (leakage), weak, moderate and strong inversion regions of conventional MOSFETs. I$_{DS}$ saturates roughly at V$_{DS}$=V$_{GS}$-V$_{th}$ in the highly conductive region but does not saturate at V$_{DS}$≈3 ϕ$_t$ in the weak/moderate conductive regions (#t=kT/q). I$_{DS}$ keeps increasing significantly after 3ϕ$_t$. This means that the Bi$_2$Se$_3$ nanowire FET does not follow the diffusion current model as described for conventional MOSFETs. I$_{DS}$ in the weak/moderate conductive regions appears to be dominated by drift current.

Figure 7D:
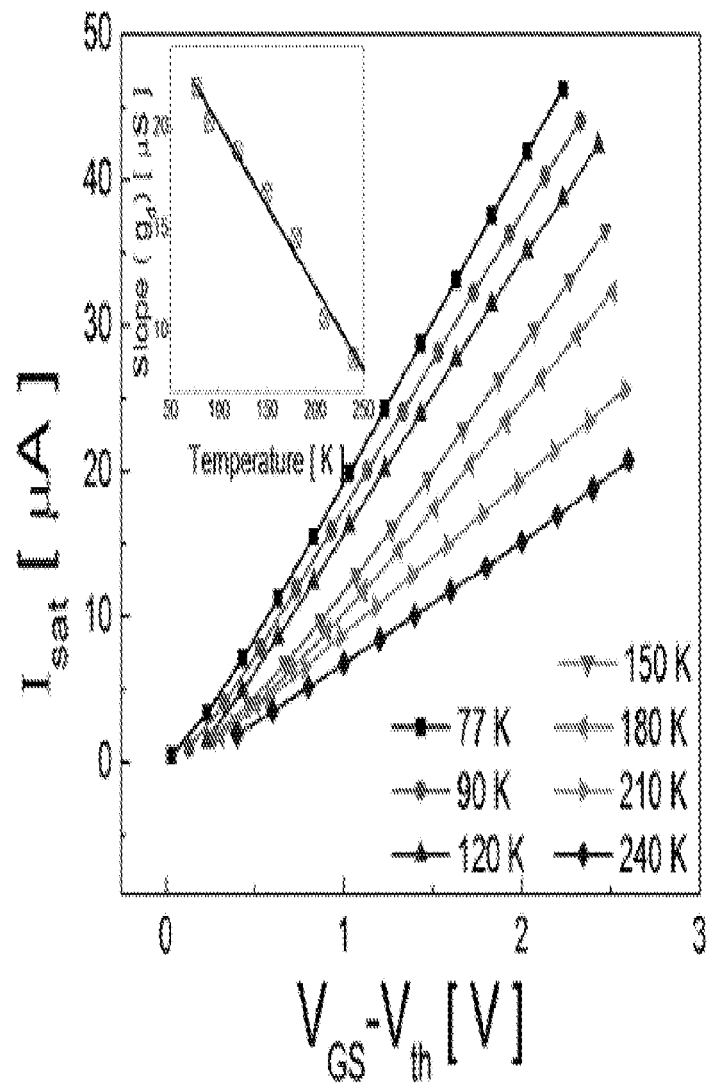

Similar I$_{DS}$-V$_{DS}$ characteristics have been obtained at different temperatures. The saturation current I$_{Dsat}$ at various V$_{GS}$ does not follow the quadratic law which predicts that I$_{Dsat}$ varies linearly with (V$_{GS}$-V$_{th}$)$^2$ as it does in conventional long-channel MOSFETs. Rather, as shown in FIG. 7(d), I$_{Dsat}$ varies linearly with the over-threshold voltage (V$_{GS}$-V$_{th}$) at different temperatures for V$_{GS}$ in the range -3.8 V to -1.4 V. The saturation current can be expressed by the drift current model as a product of the number of electrons and their velocity at the source end of the nanowire:

$$I_{Dsat} = Aqn_s v_s = \frac{C_{ox}}{L}(V_{GS} - V_{th})v_s$$

where A, n$_s$, C$_{ox}$, L and v$_s$ are nanowire cross-section area, electron concentration at source end, gate capacitance, channel length and electron velocity at the source end of Bi$_2$Se$_3$ nanowire, respectively. Therefore this linear relationship suggests that the saturation of I$_{DS}$ is due to electron velocity saturation at the source end of the channel instead of pinch-off at the drain end of the nanowire channel. The slope of each I$_{Dsat}$ vs. (V$_{GS}$-V$_{th}$) curve is saturation channel conductance (g$_{dsat}$)—its value at different temperatures is extracted from FIG. 7(d) and plotted in the inset, showing that the electron velocity at the source end increases linearly with decreasing temperature. The capacitance per unit length C$_{ox}$/L=1.3×10$^{-9}$ F/m was given by numerical calculation using a Synopsis TCAD program based on the cross-section size of the TEM image in FIG. 3(d). The calculated value of v$_s$ is from 1×10$^6$ cm/s to 2×10$^6$ cm/s for temperatures from 240 K to 77 K, which is of the same order of magnitude as the Fermi velocity of Ti in the source and drain contacts.

Electron Mobility

Figure 8A:
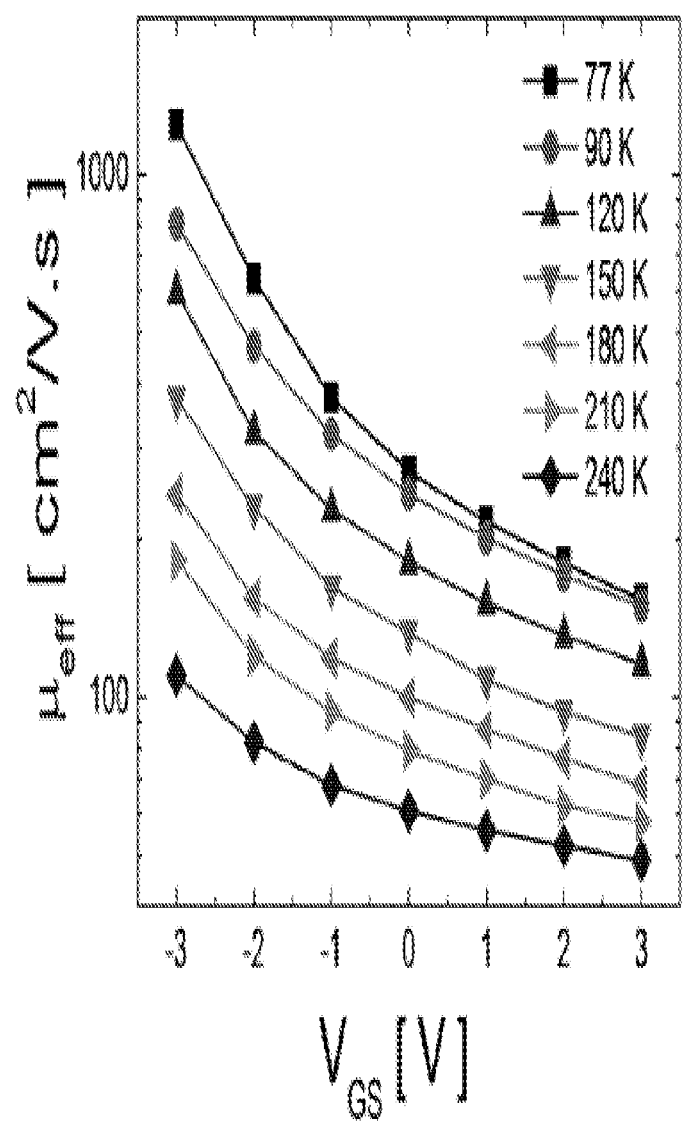
FIG. 8 shows the electron effective mobility of $Bi_2Se_3$ NWFET.

FIG. 8(a) shows the electron effective mobility (µ$_{eff}$) of Bi$_2$Se$_3$ NWFET as a function of applied gate voltage at different temperatures, which is a new aspect for Bi$_2$Se$_3$. The electron mobility reaches up to about 5000 cm$^2$Ns, significantly better than conventional Si-based MOSFETs which have effective mobility of as high as about 500 cm$^2$Ns.

The field effect mobility extracted from the I$_{DS}$-V$_{GS}$ curves shows a similar result. The effective mobility values were extracted from the linear region of I$_{DS}$-V$_{DS}$ curves by using the following equation:

$$\frac{\partial I_{DS}}{\partial V_{DS}} = \mu_{eff}\frac{C_{ox}}{L^2}(V_{GS} - V_{th})$$

The electron effective mobility decreases with increasing gate voltage in the range 200 cm$^2$Ns to 1300 cm$^2$Ns at 77 K. Numerically calculated gate capacitance affects the precision of effective mobility estimation, due to the top and bottom gate coupling.

Figure 8B:
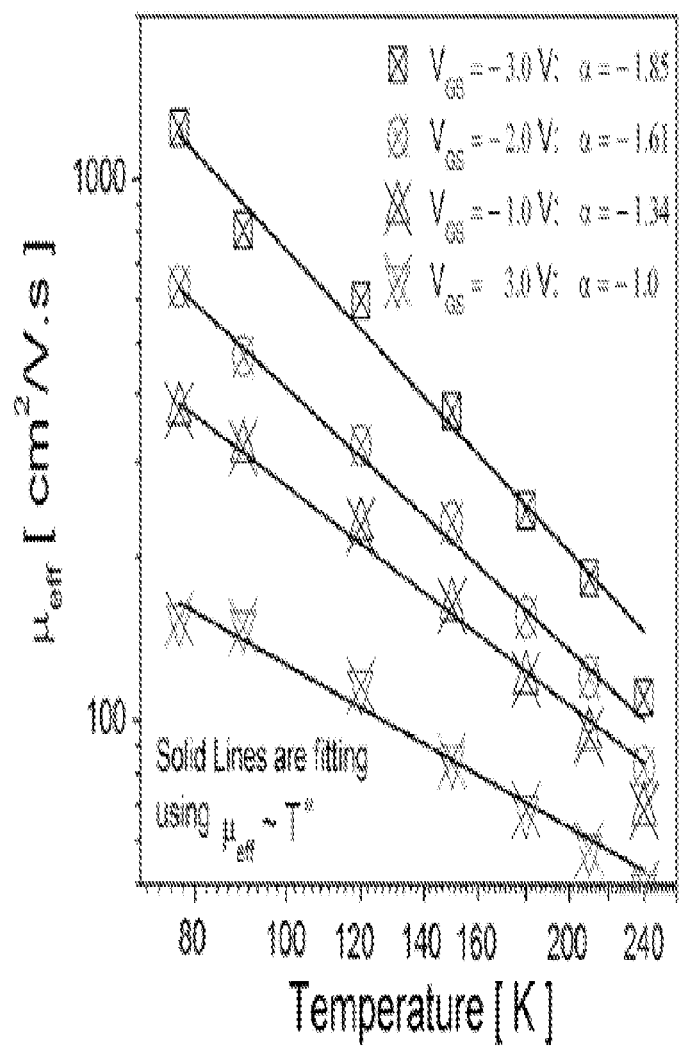

In FIG. 8(b), electron effective mobility as a function of temperature at different gate voltages is plotted and fitted using µ$_{eff}$~T$^\alpha$. The value of a is about -1.85 at small over-threshold voltage and increases to -1.0 at large over-threshold voltage. Larger over-threshold voltage will induce higher vertical electric fields. These mobility-temperature relationships suggest that electron-phonon scattering is a dominating factor in low-field conduction (optical phonon scattering for -2.0>α>-1.5, acoustic phonon scattering for α≈-1.5), and as the gate electric field increases, interface charge Columbic scattering limits electron mobility in the Bi$_2$Se$_3$ nanowire FETs with α~-1.

Transfer Characteristics

Figure 9A:
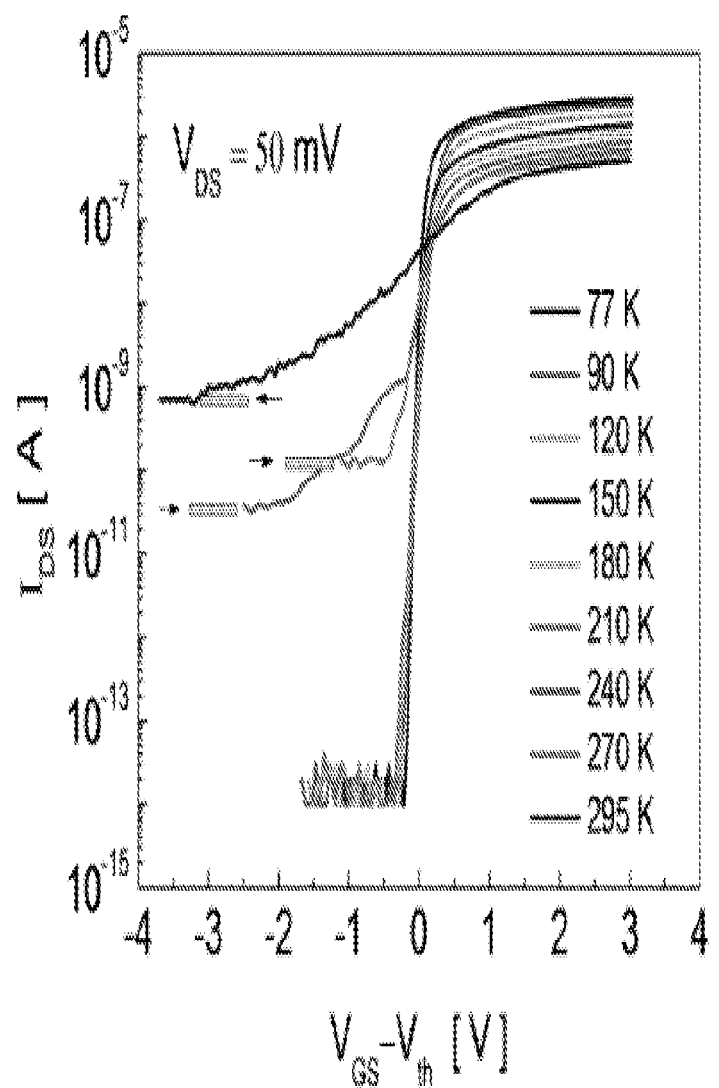
FIG. 9(*a*)-(*d*) illustrate the transfer characteristics of $Bi_2Se_3$ NWFET at different temperatures.
Figure 9B:
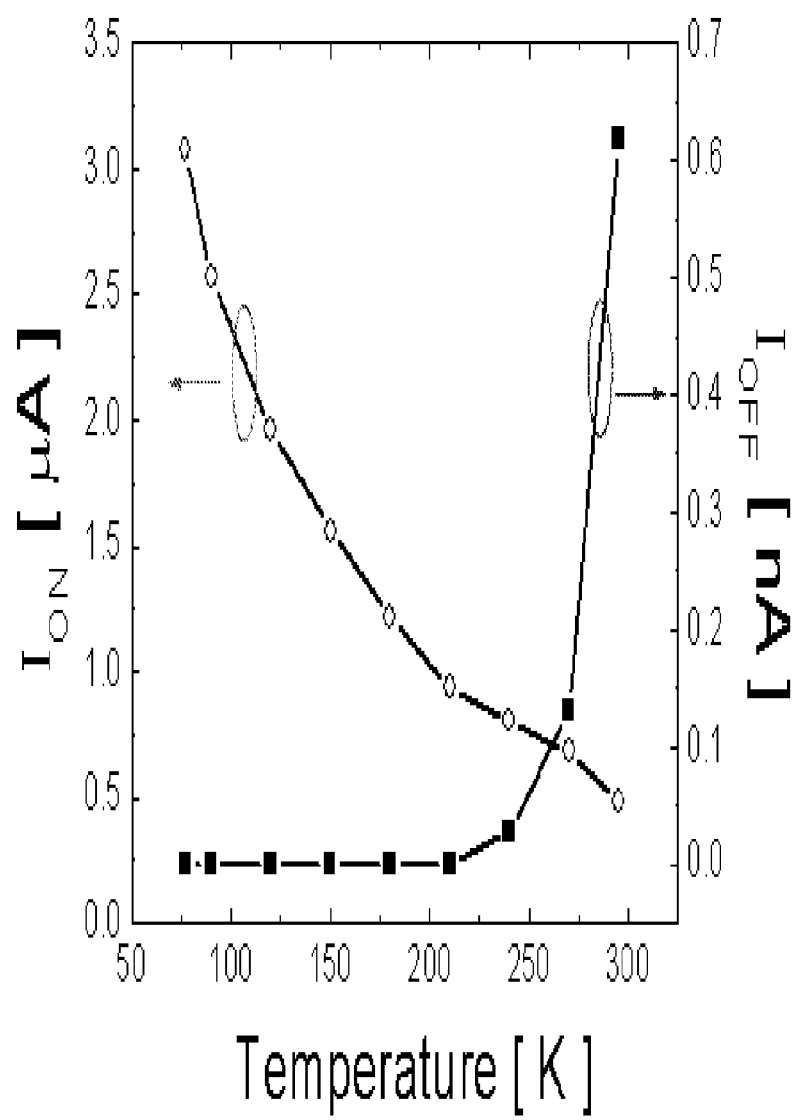
Figure 9C:
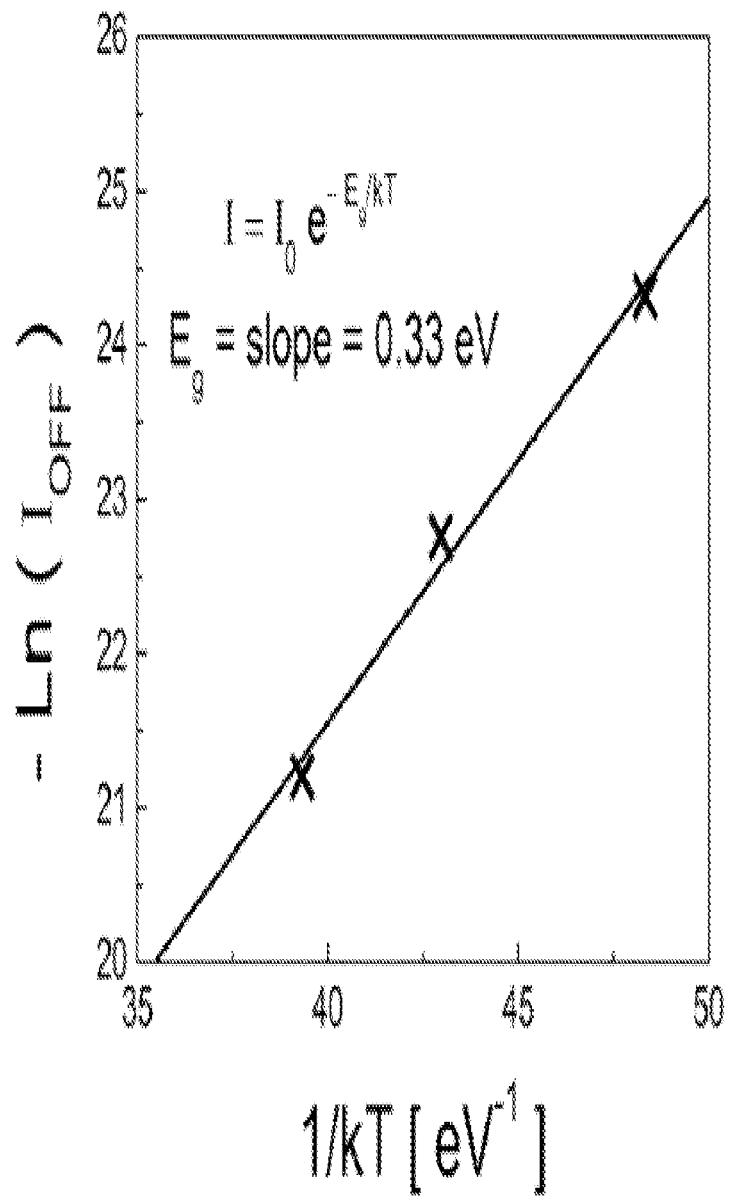

FIG. 9(a) shows a comparison of the transfer characteristics FIG. 4 (a) compares the transfer characteristics (I$_{DS}$-V$_{GS}$) of a Bi$_2$Se$_3$ nanowire FET at different temperatures, all of which show unipolar, n-type, field effect behaviors. The I$_{DS}$-V$_{GS}$ curves obtained at temperatures lower than 240 K show a clear cutoff region (I$_{DS}$≈0) in the subthreshold region (V$_{GS}$<V$_{th}$) and a large On/Off current ratio reaching 108. The Off-state current for temperatures >240 K flattens and saturates at negative voltages much below V$_{th}$. The temperature dependence of currents in the On- and Off-states are summarized in FIG. 9(b). The Off-state current for temperatures above 240 K was taken from the flat region while the On-state current was taken at V$_{GS}$=2.0 V. The Off-state current starts increasing rapidly as the temperature increases above 240 K, while the On-state current keeps decreasing as the temperature increases. Such temperature dependence indicates metallic conduction in the On-state and insulating behavior in the Off-state. FIG. 9(c) shows a fitting of the strongly activated temperature-dependent current to I$_{DS,Off}$=I$_0$e$^{-E_a/kT}$ where E$_a$ is the activation energy, k is Boltzmann's constant, and I$_0$ is a constant prefactor. The fit shows that E$_a$ is about 0.33 eV, which is very close to reported bandgap value of bulk Bi$_2$Se$_3$.

Analysis of Prototype NWFET

The following paragraphs discuss the phenomena relating to the experimental operation of the prototype embodiment of Bi$_2$Se$_3$ NWFET devices. In the Off-state, the gate voltage is large enough to deplete the electrons from the nanowire. The small, temperature dependent Off-state current is due to thermal excitations across the energy band gap of the bulk of Bi$_2$Se$_3$. It also indicates that the electric field generated by the gate voltage below the threshold is likely to be strong enough to modify the spectrum of the nanowire and destroy the surface conduction channels. Numerical simulation has demonstrated that electric field could drive a topological insulator across a quantum phase transition to become a trivial band insulator. In contrast to conventional semiconductor nanowires, the saturated current in the On-state is linear in gate voltage, indicating metallic conduction, and is most likely flowing at the surface of the nanowire. This interpretation is also consistent with the temperature dependence of the saturated conductance. These two regimes, the surface metallic conduction and the insulating switch-off, can be controlled by a surprisingly small gate voltage (a few Volts). The data do not unambiguously confirm or rule out the presence of Helical Dirac fermions.

Figure 9D:
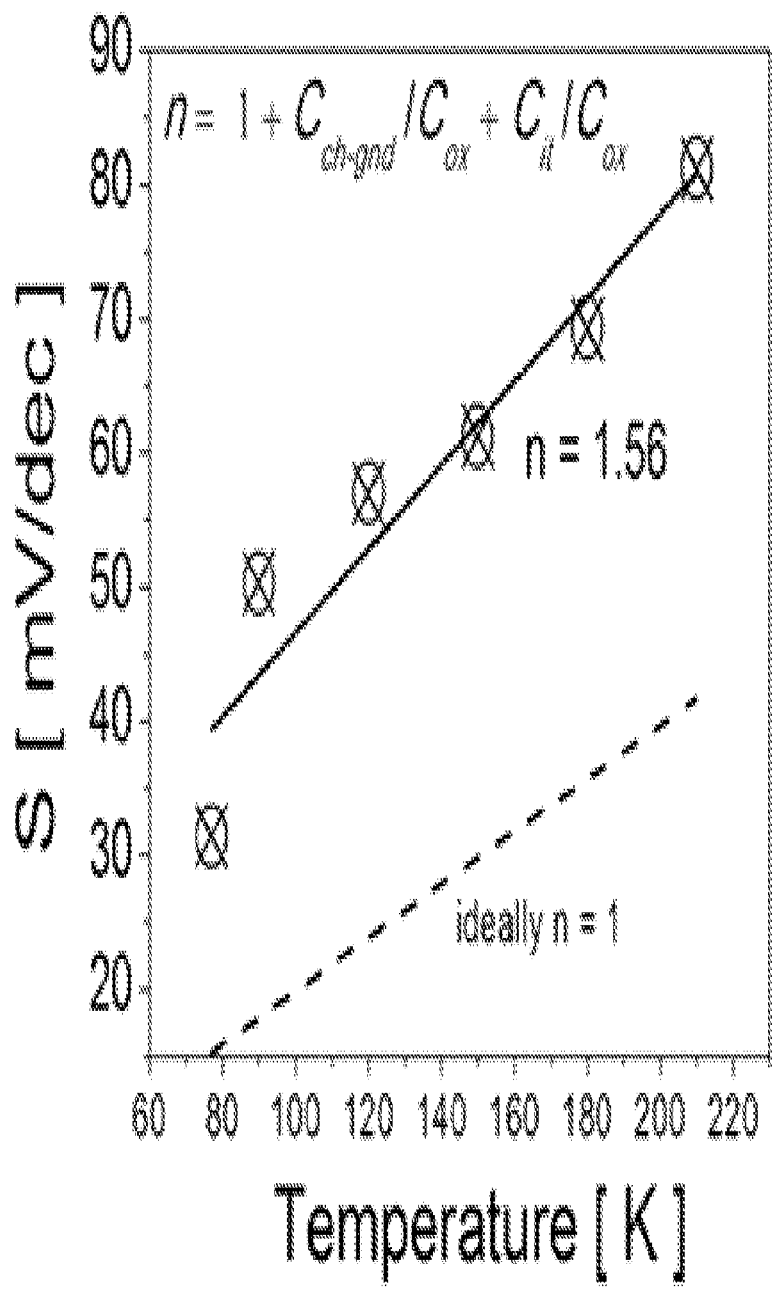

The switching performance of a FET can be characterized by its subthreshold swing (S) which is defined as the $V_{GS}$ swing to achieve 10 time increase of $I_{DS}$ in the subthreshold region. While these $Bi_2Se_3$ nanowire FETs have a larger S value than the ideal thermodynamic limit, it is still much smaller than those often reported for nanowire-FETs based on conventional semiconductors. FIG. 9(d) shows the subthreshold swing of the $Bi_2Se_3$ nanowire FET at different temperatures and its fit to:

$$S = \ln 10 \frac{kT}{q} n = \ln 10 \frac{kT}{q}\left(1 + \frac{C_{ch-gnd}}{C_{ox}} + \frac{C_{it}}{C_{ox}}\right)$$

where $C_{ch-gnd}$ is the capacitance between the nanowire surface and ground, and $C_{it}$ is interface state capacitance. It should be noted that the effect of dielectric interface states is negligible at low temperature because $I_{DS}$–$V_{GS}$ has almost zero hysteresis (see FIG. 7(a)). From the fitting which assumes $C_{ch-gnd}/C_{ox}$ has no temperature dependence, $C_{ch-gnd}$ is about $0.56 C_{ox}$ or $7.3 \times 10^{-10}$ F/m for the $Bi_2Se_3$ nanowire.

Electromagnetic Properties

Figure 10:
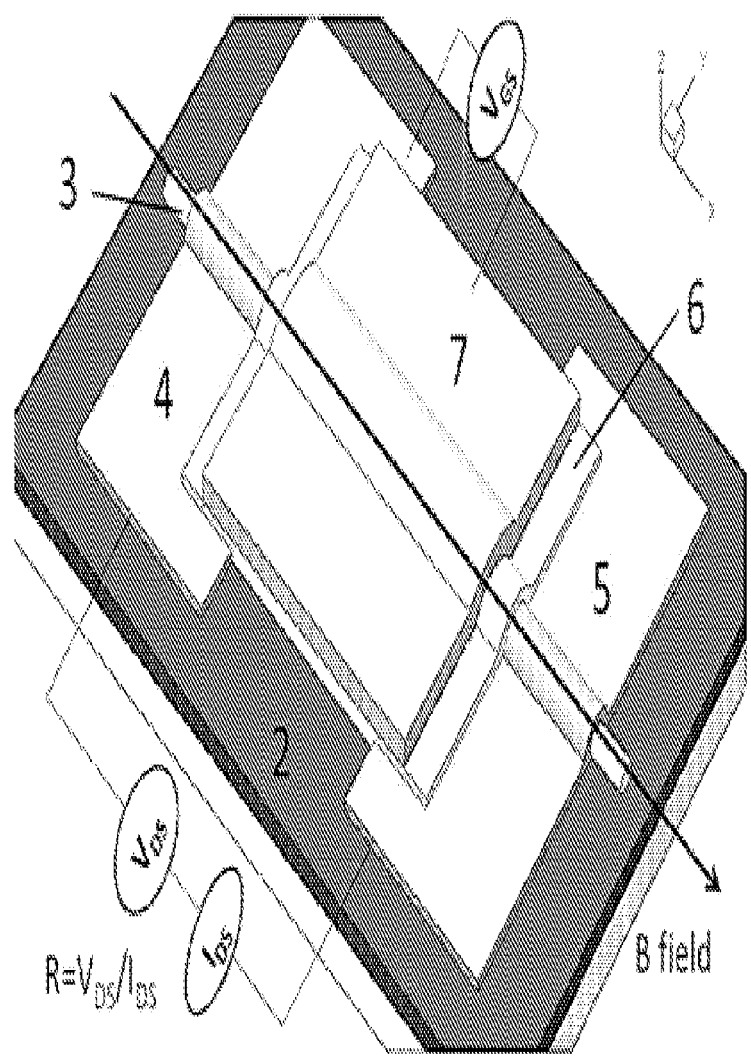
FIG. 10 is a schematic of a prototype $Bi_2Se_3$ NWFET with magnetic field along the axis of the nanowire illustrated.

The top-gated $Bi_2Se_3$ nanowire field effect transistors exhibited remarkable response to the external magnetic field. The magnetic field existed in the prototype device in direction along the nanowire axis (i.e., parallel to the x-axis). FIG. 10 shows the design of an embodiment of the prototype $Bi_2Se_3$ NWFET for examining electromagnetic properties, which is generally similar to the schematic shown in FIG. 3(c).

Due to the properties of the topological insulator $Bi_2Se_3$, only the nanowire surface is still conductive (the body of the nanowire is insulating) at low temperature. Theoretically, such a conductive surface will exhibit the Aharonov-Bohm solenoid effect, in which an electrically charged particle (e.g., electron) is affected by an electromagnetic field (B). One can observe the Aharonov-Bohm effect when the wave function of an electron passing around a long solenoid experiences a phase shift as a result of the enclosed magnetic field. The Aharonov-Bohm effect exists despite the magnetic field being negligible in the region through which the electron passes and the electron's wave function being negligible inside the solenoid.

The surface of topological insulator $Bi_2Se_3$ nanowire acts as a solenoid. In the presence of a magnetic field perpendicular to the cross-section of the nanowire, the electrons pass along the surface from the source end to the drain end of the FET have different path. The electron can go straight from one end to another, or make circles surrounding the nanowire before reaching the drain end. The phase of the electron wave function will shift depending on the path the electrons take. Therefore, the electrons taking different paths will have interference with each other when they meet in the end of the nanowire. The interference will lead to the oscillation in the conductance (or resistance) of the $Bi_2Se_3$ nanowire FET. The Aharonov-Bohm oscillation of the $Bi_2Se_3$ nanowire FET is shown in FIG. 11.

Figure 11:
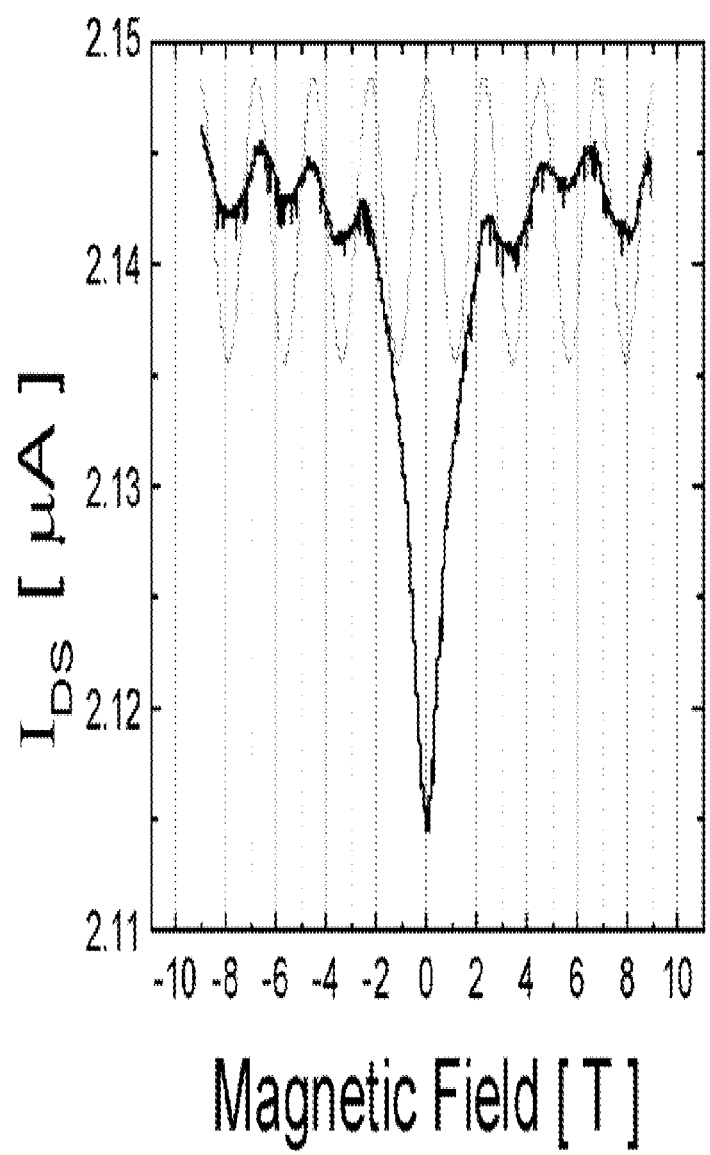
FIG. 11 shows the Aharonov-Bohm oscillation of a prototype NWFET measured at 4.0 K.
Figure 12A:
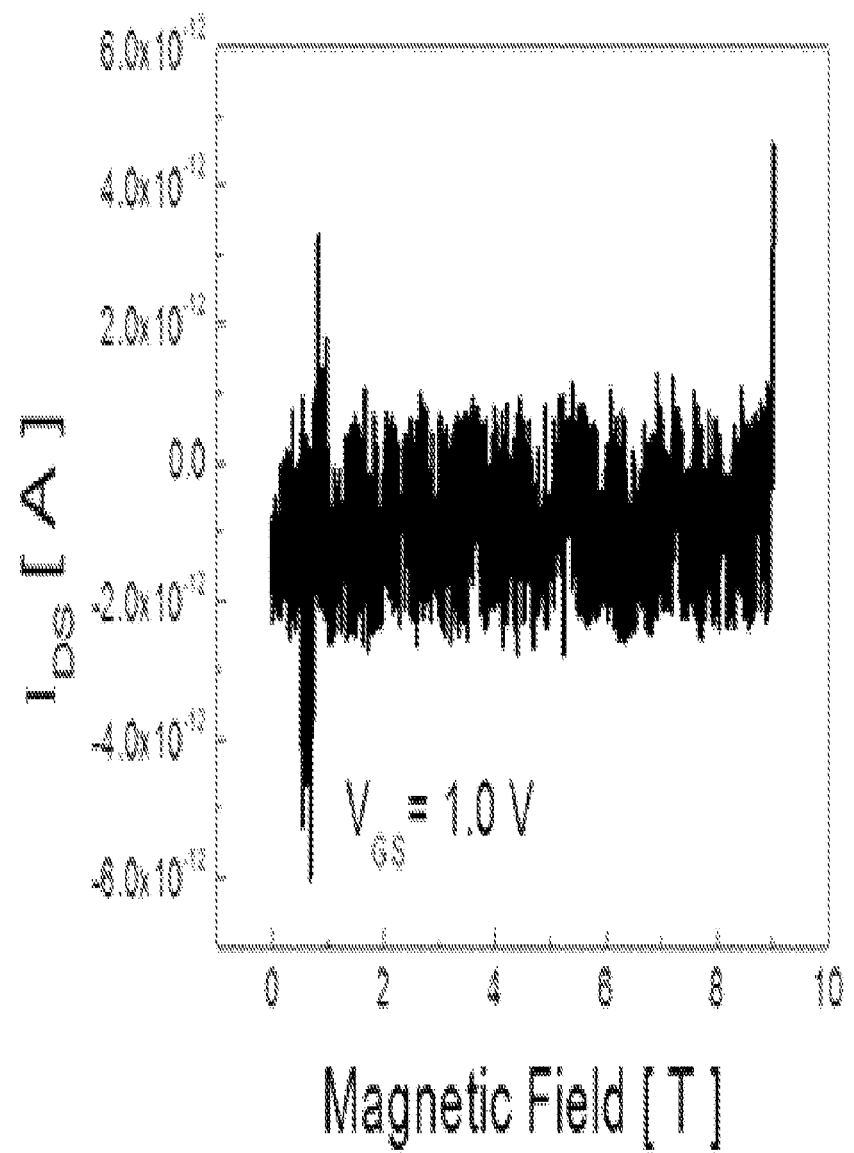
FIGS. 12(*a*)-(*h*) show measurements of the drain current $I_{DS}$ as a function of parallel magnetic field for different $V_{GS}$.
Figure 12B:
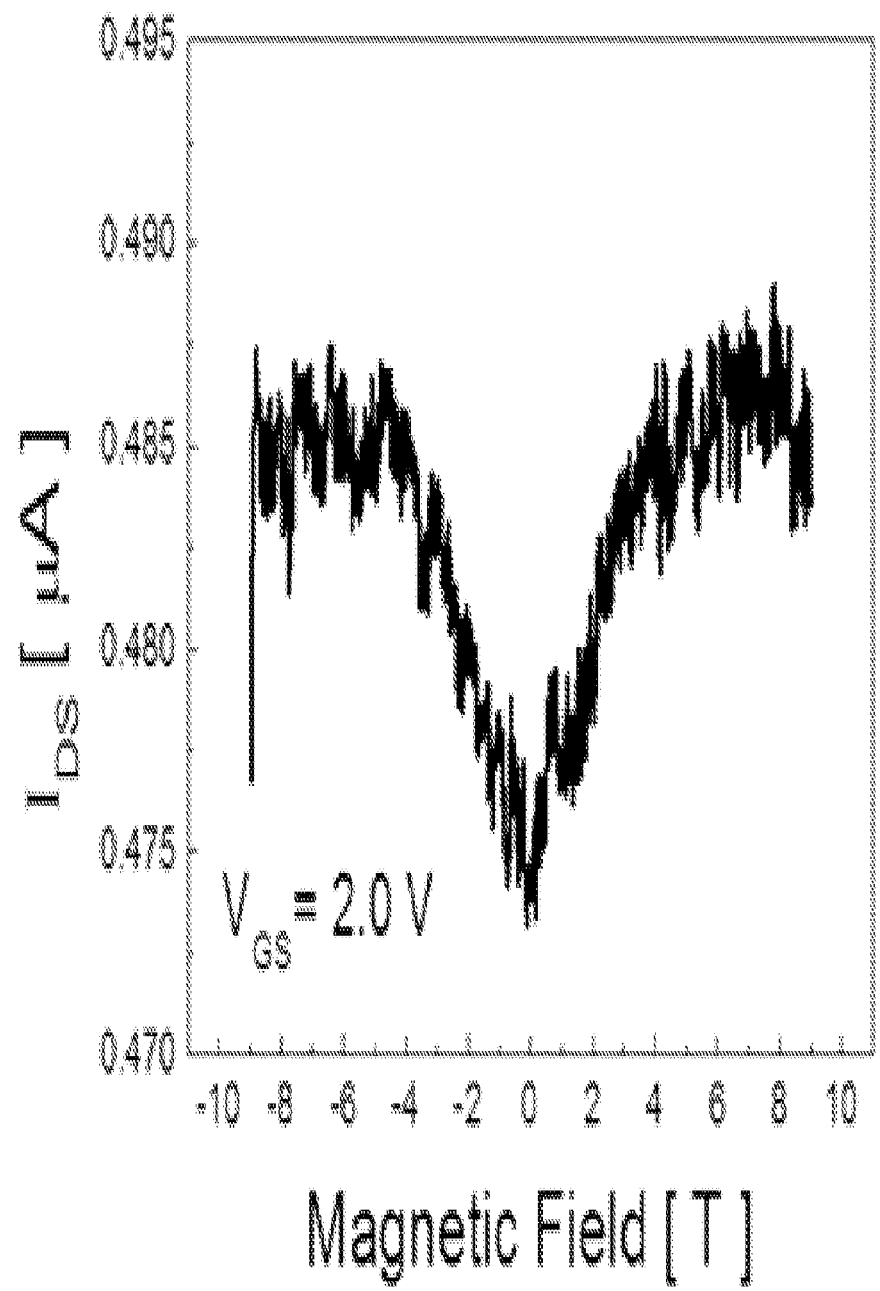
Figure 12C:
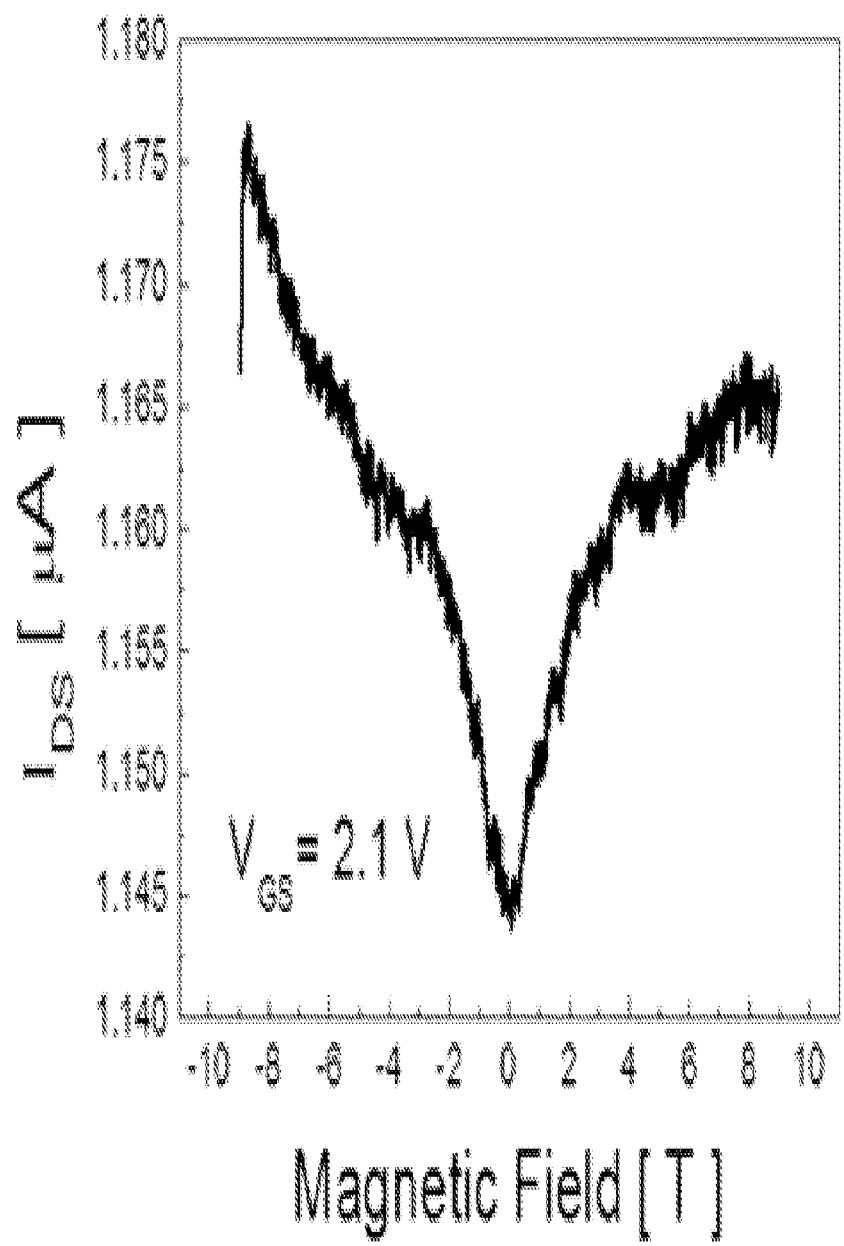
Figure 12D:
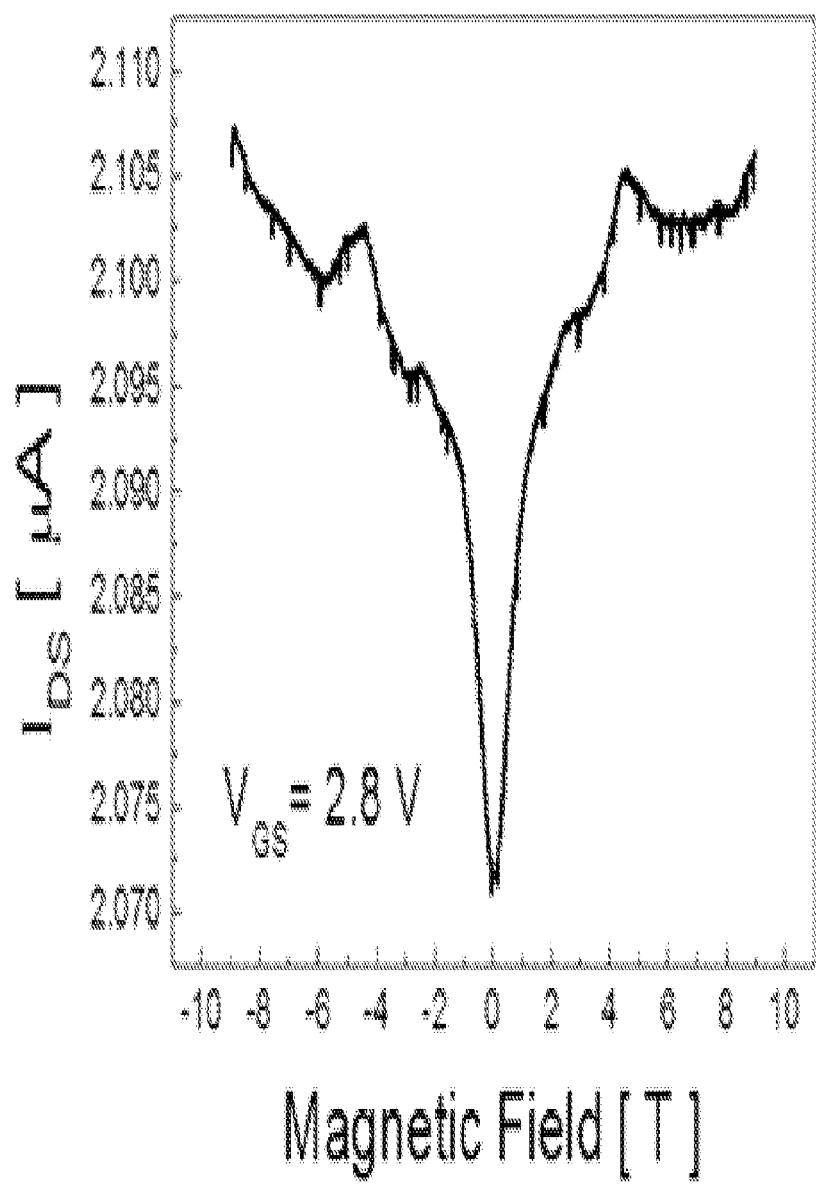
Figure 12E:
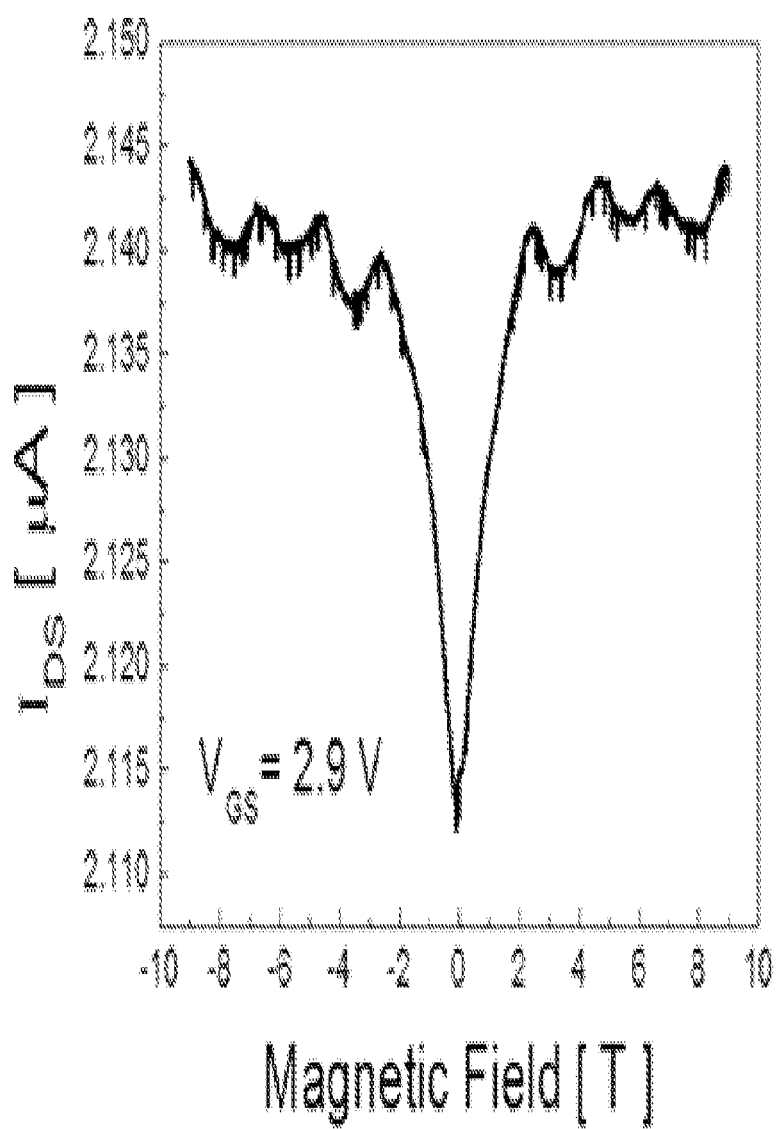
Figure 12F:
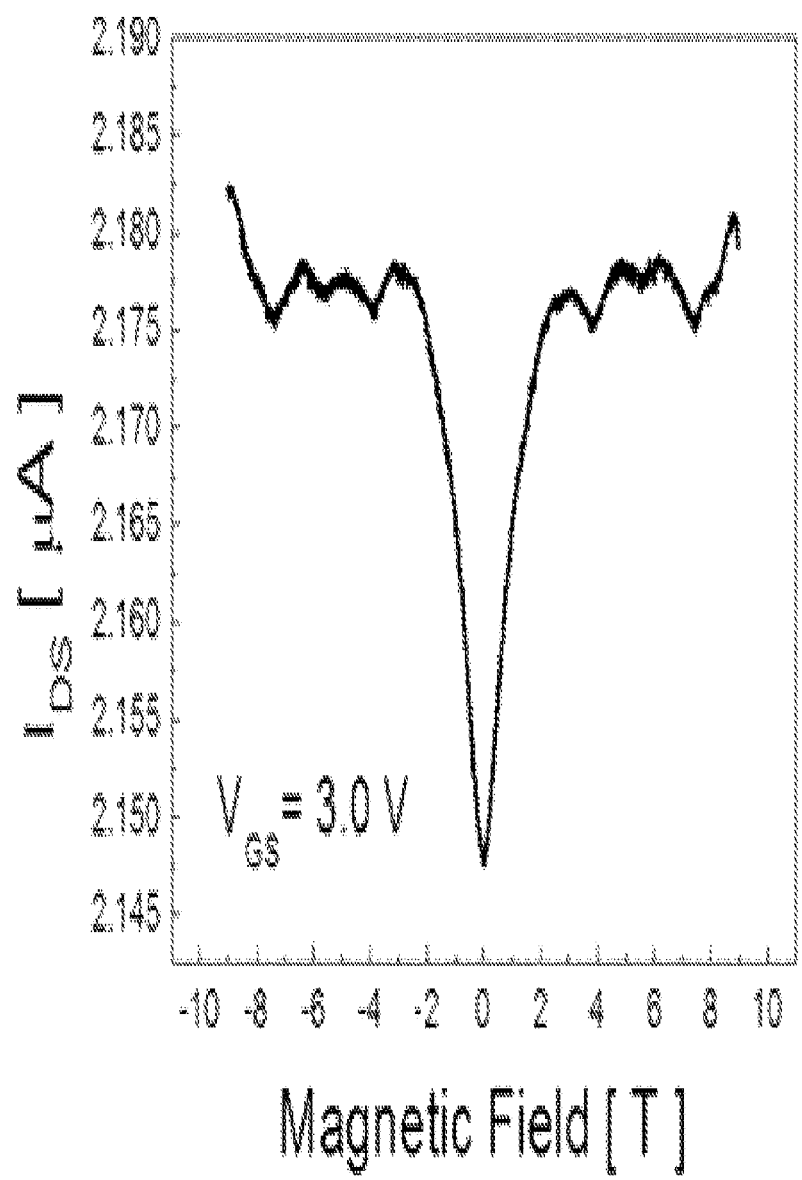
Figure 12G:
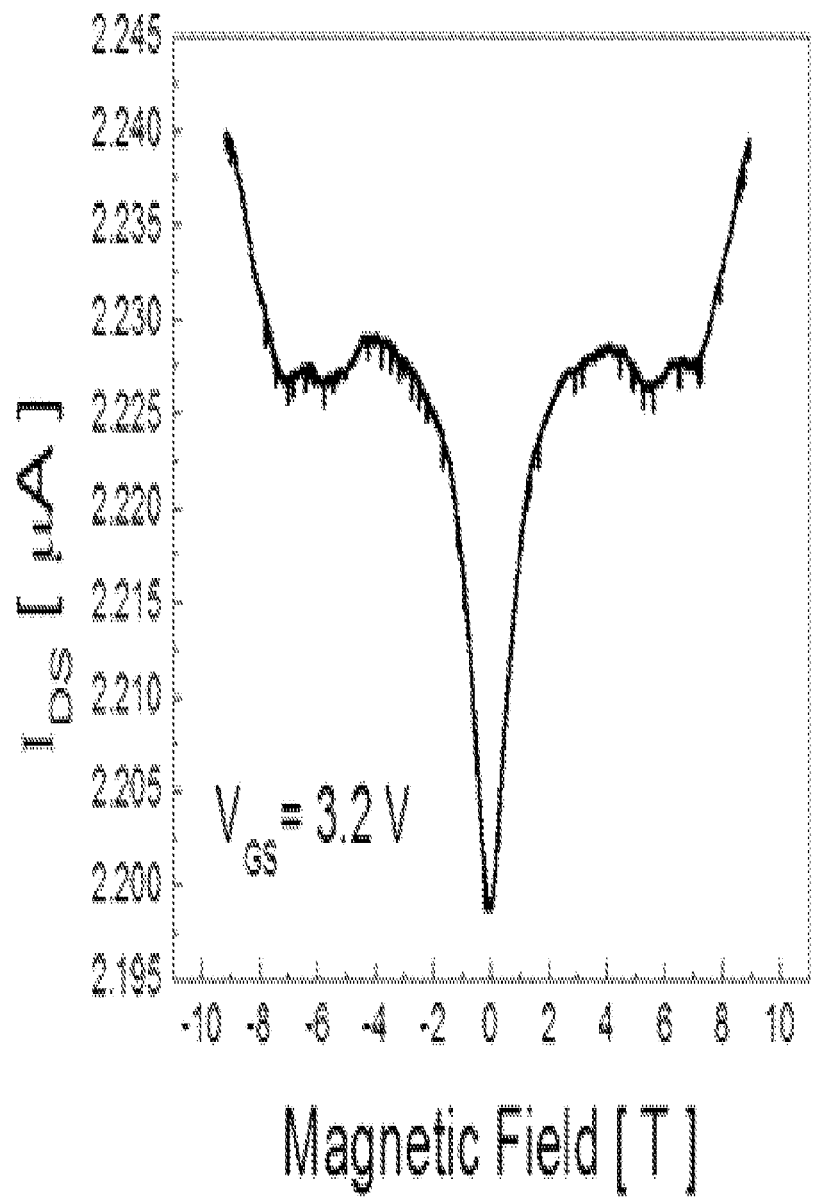
Figure 12H:
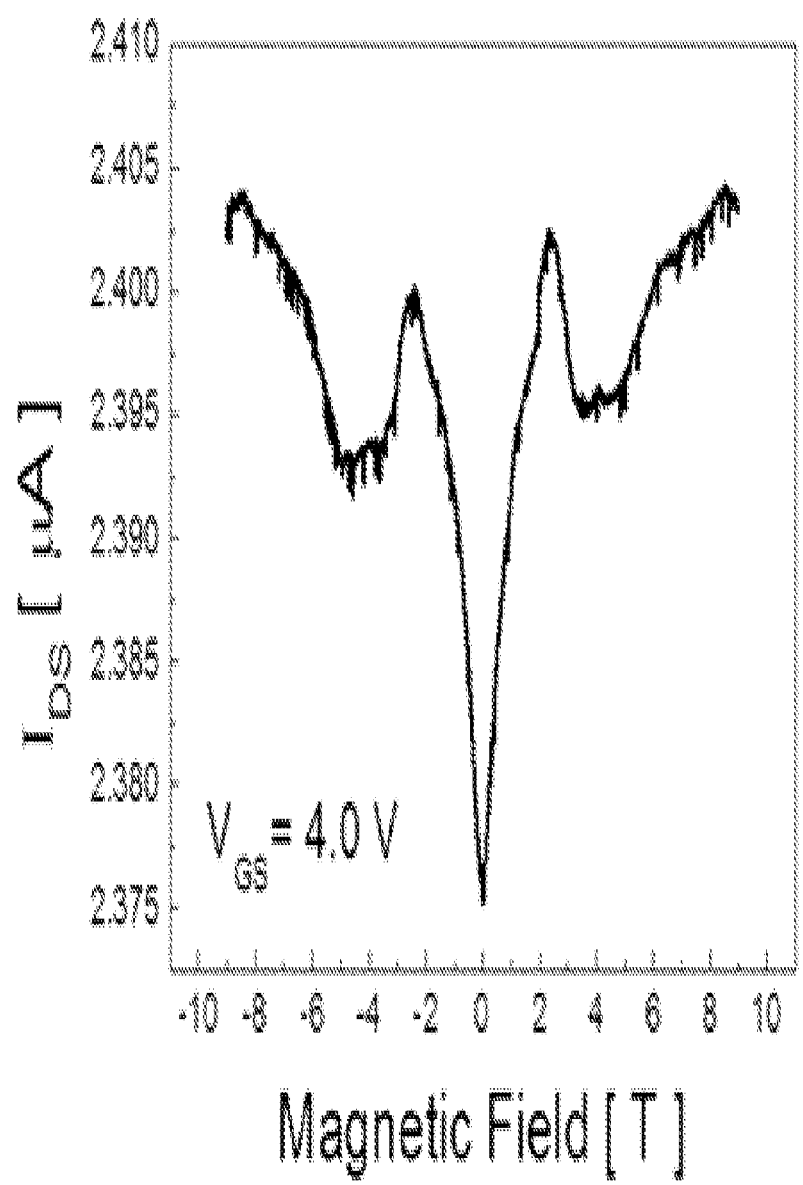

FIG. 11 shows the Aharonov-Bohm oscillation of the $Bi_2Se_3$ NWFET measured at 4.0 K. The current first increases with increasing magnetic field from 0 T to ±2.0 T (unit is Tesla). This is due to the de-localization of electron. The current (or the conductance) of the device oscillates from 2.0 T to 9.0 T. The cosine wave curve is a fitting curve used to demonstrate the oscillation period of 2.2 T.

As can be seen in FIG. 11, the current of $Bi_2Se_3$ nanowire FETs changed as the external magnetic field changed. This change can be used in applications such as magnetic field sensing. In addition, the period of the Aharonov-Bohm oscillation is also dependent on the magnitude of magnetic field. The relationship is shown in the following equation:

$$T_B = n\frac{h}{e}\Big/ S$$

where $T_B$ is the period of Aharonov-Bohm oscillation, n is an integer, h is the Planck constant, e is the electron charge, and S is the area of $Bi_2Se_3$ nanowire cross-section. This oscillation period can be used to determine the size of the nanowire. The magnitude of the current can be used to determine the magnitude of the external magnetic field.

Transistor devices as described herein have potential application in magnetic sensors. FIGS. 12(a)-12(h) show drain current $I_DS$ of an embodiment prototype NWFET measured at $V_{DS}$=50 mV under a varying parallel magnetic field from −9.0 V to 9.0 V for different $V_{GS}$. A negative magnetic field represents that the magnetic field direction is opposite from the current direction. The magnetoresistance can be calculated by $R=V_{DS}/I_{DS}$. As seen in FIGS. 12(a)-12(h), the magnetoresistance is strongly dependent on magnetic field in the On-state of the NWFET, while it does not change with magnetic field in the Off-state. In addition, the drain current, and therefore the magnetoresistance, is oscillating under the external parallel magnetic field, with a period of about 2.1 T. As the $V_{GS}$ increases, this oscillation disappears. These results indicate that the $Bi_2Se_3$ NWFETs can be used for magnetic sensors.

SUMMARY

In summary, topological insulator transistors, such as the exemplary $Bi_2Se_3$ nanowire field-effect transistors described above, may be fabricated, such as by using a self-alignment technique as discussed above, and embodiments have demonstrated excellent device characteristics. The NWFETs show unipolar, n-type behavior with a clear cutoff in the Off-state with only thermally activated conduction at relatively high temperatures, and a well-saturated output current indicating surface metallic conduction. The effective mobility extracted for different gate voltages and temperatures indicates phonon scattering at low gate electric fields, i.e., electric fields at a gate voltage slightly above threshold voltage, such as about 5% to 15% above threshold voltage, and surface Columbic scattering at large gate electric fields, i.e., electric fields operating above threshold voltage, such as about 50% to 95% above threshold voltage. The achievement of sharp switching from Cutoff to surface conduction and saturation current by a gate voltage of a few volts is neither expected nor has been previously reported. The different scaling behavior of the saturation current versus gate voltage in these devices relative to most conventional semiconductor nanowire FETs may lead to novel circuit applications. Because the spin and momentum are locked in the surface states of topological insulators, the results open up the possibility of electric manipulation of spin current using gate voltage. Overall, the characteristics of embodiments of $Bi_2Se_3$ NWFETs described above demonstrate that topological insulator transistors have excellent performance, and are well-suited for numerous logic, memory and sensing applications.

What is claimed is:

1. A transistor comprising:
a source;
a drain;
a conduction channel comprising a topological insulator material nanowire between the source and the drain, wherein the topological insulator material nanowire has a diameter in a range from about 1 nm to about 100 nm; and
a first gate over the topological insulator material nanowire, wherein applying a threshold voltage to the first gate switches the transistor from an off-state to an on-state.

2. The transistor of claim 1, wherein the topological insulator material nanowire is physically connected to the source and the drain.

3. The transistor of claim 1, wherein the first gate is spaced apart from the topological insulator material nanowire by a dielectric material.

4. The transistor of claim 3, wherein the dielectric material comprises a first oxide material.

5. The transistor of claim 1, wherein the source, the drain, and the topological insulator material nanowire are disposed over a substrate.

6. The transistor of claim 5, wherein the substrate further comprises an oxide layer.

7. The transistor of claim 6, wherein the oxide layer comprises a second oxide material.

8. The transistor of claim 1, wherein the topological insulator material nanowire is self-aligned.

9. The transistor of claim 1, wherein the topological insulator material nanowire is a single crystal nanowire.

10. The transistor of claim 1, wherein the topological insulator material nanowire comprises one or more of Bismuth and Tellurium.

11. The transistor of claim 10, wherein the topological insulator material nanowire comprises $Bi_2Se_3$.

12. A transistor comprising:
a source;
a drain;
a conduction channel comprising a topological insulator material nanowire between the source and the drain, wherein the topological insulator material nanowire has a diameter in a range from about 50 nm to about 150 nm; and
a first gate over the topological insulator material nanowire, wherein applying a threshold voltage to the first gate switches the transistor from an off-state to an on-state.

13. The transistor of claim 12, wherein as an electric field applied to the topological insulator material nanowire increases, a dominating factor of electron mobility within the topological insulator material nanowire transitions from phonon scattering to coulomb scattering.

14. The transistor of claim 1, wherein the topological insulator material nanowire functions as a metallic conductor when a positive gate voltage is applied to the topological insulator material nanowire, and wherein the topological insulator material nanowire functions as an insulator when a negative gate voltage is applied to the topological insulator material nanowire.

15. The transistor of claim 1, wherein the topological insulator material nanowire is configured to allow electrons to travel in circles surrounding the topological insulator material nanowire while traveling from the source to the drain.

16. A method, comprising:
applying a first gate voltage to a topological insulator material nanowire in a device, wherein the topological insulator material nanowire is between a source and a drain of a transistor of the device, wherein the topological insulator material nanowire has a diameter in a range from about 1 nm to about 100 nm;
receiving a first current characteristic of an insulator from the topological insulator material nanowire while the first gate voltage is applied to the topological insulator material nanowire;
applying a second gate voltage to the topological insulator material nanowire; and
receiving a second current characteristic of a metal from the topological insulator material nanowire while the second gate voltage is applied to the topological insulator material nanowire, wherein the second current characteristic represents an on-state of the transistor and the first current characteristic represents an off-state of the transistor.

17. The method of claim 1, wherein the first gate is a top-surround gate configured to at least partially surround the topological insulator material nanowire.

18. The method of claim 17, wherein a dielectric layer is disposed between the top-surround gate and the topological insulator material nanowire.

19. The method of claim 17, wherein the topological insulator material nanowire is a single crystal nanowire grown from a catalyst and integrated by using a self-alignment technique.

20. The method of claim 19, wherein the catalyst comprises Au.

* * * * *